(12) United States Patent
Li et al.

(10) Patent No.: US 10,329,905 B2
(45) Date of Patent: Jun. 25, 2019

(54) METHOD TO ESTIMATE THE INFLUENCE OF PORE-SIZE DISTRIBUTION ON PHASE EQUILIBRIUM OF MULTI-COMPONENT HYDROCARBON SYSTEMS IN UNCONVENTIONAL SHALE GAS AND OIL RESERVOIRS

(71) Applicants: Baoyan Li, Tomball, TX (US); Alberto G. Mezzatesta, Houston, TX (US)

(72) Inventors: Baoyan Li, Tomball, TX (US); Alberto G. Mezzatesta, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 458 days.

(21) Appl. No.: 15/093,026

(22) Filed: Apr. 7, 2016

(65) Prior Publication Data

US 2017/0292373 A1   Oct. 12, 2017

(51) Int. Cl.
*G06F 17/50* (2006.01)
*E21B 49/00* (2006.01)

(52) U.S. Cl.
CPC .............. *E21B 49/00* (2013.01); *G06F 17/50* (2013.01)

(58) Field of Classification Search
USPC .......................................... 703/2, 9; 702/11
See application file for complete search history.

(56) References Cited

U.S. PATENT DOCUMENTS

| | | | |
|---|---|---|---|
| 4,903,207 A | 2/1990 | Alger et al. | |
| 6,985,841 B2 | 1/2006 | Barroux | |
| 7,054,749 B1 | 5/2006 | O'Meara, Jr. | |
| 7,072,809 B2 | 7/2006 | Egermann et al. | |
| 7,352,179 B2 | 4/2008 | Chen et al. | |
| 7,548,840 B2 | 6/2009 | Saaf | |
| 7,596,480 B2 | 9/2009 | Fung et al. | |
| 8,061,444 B2 | 11/2011 | Mullins et al. | |
| 8,718,993 B2 | 5/2014 | Klie | |
| 2002/0120429 A1 | 8/2002 | Ortoleva | |
| 2002/0177986 A1* | 11/2002 | Moeckel | G06F 17/5018 703/9 |

(Continued)

OTHER PUBLICATIONS

Adesida, et al.; "Kerogen Pore Size Distribution of Barnett Shale using DFT Analysis and Monte Carlo Simulations"; (2011); SPE 147397; 14 pages.

(Continued)

*Primary Examiner* — Thai Q Phan
(74) *Attorney, Agent, or Firm* — Cantor Colburn LLP

(57) ABSTRACT

A method for estimating liquid and vapor molar fraction of components, liquid mole fraction, vapor mole fraction, liquid saturation, and vapor saturation of a mixture of hydrocarbons in nano-pores in an earth formation includes: constructing an equation of state (EOS) representing the mixture hydrocarbons in the nano-pores in the earth formation; the EOS having a term accounting for capillary pressure in the nano-pores. The method further includes inputting a composition of the mixture of hydrocarbons, a phase pressure of the hydrocarbons and a pore size distribution of the earth formation into the EOS and solving the EOS and to estimate the liquid and vapor molar fraction of components, liquid mole fraction, vapor mole fraction, liquid saturation, and vapor saturation of the mixture of hydrocarbons in the nano-pores in the earth formation.

19 Claims, 21 Drawing Sheets

(56) References Cited

U.S. PATENT DOCUMENTS

| | | | |
|---|---|---|---|
| 2013/0151159 A1 | 6/2013 | Pomerantz et al. | |
| 2013/0297273 A1 | 11/2013 | Altundas et al. | |
| 2014/0184230 A1 | 7/2014 | Anderson et al. | |
| 2014/0200810 A1 | 7/2014 | Zuo et al. | |
| 2016/0040532 A1* | 2/2016 | Freitas | E21B 47/06 702/11 |

OTHER PUBLICATIONS

Ambrose, et al.;"NewPore-scale Considerations for Shale Gas in Place Calculations"; SPE 131772 presented at SPE Unconventional Gas Conference, Feb. 2010; 17 pages.

Ambrose,et al.;"Multi-component sorbed phase considerations for Shale Gas-in-place Calculations"; SPE 141416 presented at SPE Production and Operations Symposium, Mar. 2011; 10 pages.

Burdine, N.T.; "Relative Permeability Calculations From Pore Size Distribution Data";Petroleum Transactuins, Aime; vol. 198 (1953); 8 pages.

Chen, et al.; "Capillary Condensation and NMR Relaxation Time In Unconventional Shale Hydrocarbon Resources"; SPWLA 53rd Annual Logging Symposium,Jun. 2012; 9 pages.

Deinert, et al.; "Effect of pore structure on capillary condensation in a porous medium"; Physical Review E 79, 0212; 2009; 3 pages.

Deo, et al.; "Liquids from Shales Reservoir Description & Dynamics I Phase 2";(2014); EGI Energy & Geoscience Institute at the University of Utah; 20 pages.

Gelb, et al.; Molecular Simulation of Capillary Phenomena in Controlled Pore Glasses; 1998; 8 pages.

Gelb,et al.; "Phase separation in confined systems"; Rep. Prog. Phys. 62; 1999; 87 pages.

Karger, et al.; "Dissertation"; (2009); 111 pages.

Keizer, et al.; "Fluids in pores: experimental and computer simulation studies of multilayer adsorption, pore condensation and critical-point shifts"; Pure &App/ Chem., vol. 63, No. 10, 1991; pp. 1495-1502.

Landers, et al.; "Density Functional Theory Methods for Characterization of Porous Materials"; Colloids and Surfaces A: Physicochem. Eng. Aspects 437 (2013); 30 pages.

Lastoskie,et al.; "Pore Size Distribution Analysis of Microporous Carbons: A Density Functional Theory Approach"; J. Phys. Chem. 1993, 97, pp. 4786-4796.

Leahy-Dios, et al.; "Modeling of Transport Phenomena and Multicomponent Sorption for SHale Gas and Coalbed Methane in an Unstructured Grid Simulator"; (2011); SPE 147352: 9 pages.

Li, et al.; "A Multilevel Iterative Method to Quantify Effects of Pore-Size-Distribution on Phase Equlibrium of Multi-Component Fluids in Unconventional Plays"; (2015); SPWLA 56th Annual Logging Symposium; 19 pages.

Li, et al.; "The Condition of Capillary Condensation and Its Effects on Adsorption Isotherms of Unconventional Gas Condensate Reservoirs"; SPE 166162; presented at the SPE Annual Technical Conference and Exhibition; Oct. 2013; 19 pages.

Mathia, Eliza J.; "Geological Evaluation of Posidonia and Wealden Organic-Rich Shales: Geochemical and Diagentic Controls on Pore System Evolution"; (2014); pp. 1-150.

Mathia, Eliza J.; "Geological Evaluation of Posidonia and Wealden Organic-Rich Shales: Geochemical and Diagentic Controls on Pore System Evolution"; (2014); pp. 151-227.

Mossman, C. E.; "Literature Survey of Adsorption Studies on Porous Materials" National Research Council of Canada Division of Building Research; Ottwa; Nov. 1957; 30 pages.

Neimark;et al."Quenched solid density functional theory and pore size analysis of micro-mesoporous carbons"; Carbon Jun. 2009; 14 pages.

Nojabaei, et al.; "Effect of Caplillary Pressure on Fluid Density and Phase Behavior in Tight Rocks and Shales"; (2012); SPE 159258; 16 pages.

Olivier, wt al.; "Surface Area and Microporosity of a Pillared Interlayered Clay (PILC) from a Hybrid Density Functional Theory (DFT) Method"; J. Phys.Chem. B 2001, 105; pp. 623-629.

Page, et al.; "Pore-Space Correlations in Capillary Condensation in Vycor"; Physical ReviewLetters, vol. 71, No. 8; Aug. 1993; 4 pages.

Ravikovitch,et al.; "Characterization of nanoporous materials from adsorption and desorption isotherms"; Colloids and Surfaces A: Physicochemical and Engineering Aspects 187-188; 2001; 11 pages.

Satik, et al.; "Study of Adsorption of Gases in Tight Reservoir Rocks" SPE 30732; Presentation at the SPE Annual Technical Conference & Exhibition held in Dallas, U.S.A.; Oct. 1995; 10 pages.

Shapiro et al.; "Effects of Capillary Forces and Adsorption on Reserves Distribution"; SPE 36922 presented at the 1996 SPE European Petroleum Conference held in Milan, Itatyl Oct. 1996; Oct. 24-24 8 pages.

Singh, et al.; Vapor-Liquid Phase Coexistence, Critical Properties, and Surface Tension of Confined Alkanes; J. Phys. Chem. C 2009; 113; pp. 7170-7180.

Thommes, et al.; "Pore Condensation and Critical-Point Shift of a Fluid in Controlled-Pore Glass"; Langmuir 1994; No. 10, pp. 4270-4277.

Tisot,P. R; "Fundamental Properties of Green River Oil Shale as Determined from Nitrogen Adsorption and Desorption Isotherms"; Am. Chem. Soc., Div. Fuel Chem., Prepr.; (United States); Journal vol. 1; Conference: Symposium of the American Chemical Society, Chicago, IL, USA, Sep. 3, 1961; 12 pages.

Vasilache, Mihai A.; "Fast and Economic Gas Isotherm Measurements Using Small Shale Samples"; (2010); Search and Discovery Article #40646; 37 pages.

Walls, et al.; Eagle Ford Shale Reservoir Properties from Digital Rock Physics; presented at HGS Applied Geoscience Mudrocks Conference, Feb. 2011; Woodlands, TX; 7 pages.

Whitson, et al.; "Phase Behavior"; First Printing Henry L Doherty Memorial Fund of AIME Society of Petroleum Engineers Inc.; 2000; pp. 109-230.

Whitson, et al.; "Phase Behavior"; First Printing Henry L Doherty Memorial Fund of AIME Society of Petroleum Engineers Inc.; 2000; pp. 1-108.

* cited by examiner

Critical Radius vs. Vapor Pressure $K_i$ Values vs. Vapor Pressure

METHOD TO ESTIMATE THE INFLUENCE OF PORE-SIZE DISTRIBUTION ON PHASE EQUILIBRIUM OF MULTI-COMPONENT HYDROCARBON SYSTEMS IN UNCONVENTIONAL SHALE GAS AND OIL RESERVOIRS

BACKGROUND

Hydrocarbons such as oil and gas are typically extracted from reservoirs in earth formations. Drilling and production resources are generally very expensive to operate and use. In order to control costs, it is desired to use the drilling and production resources most efficiently. By being able to accurately estimate properties of the earth formation, the drilling and production resources can be used in an efficient manner. Therefore, it would be well received in drilling and production industries if techniques were developed to accurately and efficiently estimate properties of earth formations.

BRIEF SUMMARY

Disclosed is a method for estimating liquid and vapor molar fraction of components, liquid mole fraction, vapor mole fraction, liquid saturation, and vapor saturation of a mixture of hydrocarbons in nano-pores in an earth formation The method includes: constructing, by a processor, an equation of state (EOS) representing the mixture hydrocarbons in the nano-pores in the earth formation; the EOS comprising a term accounting for capillary pressure in the nano-pores; inputting, by the processor, a composition of the mixture of hydrocarbons and a phase pressure of the hydrocarbons into the EOS; inputting, by the processor, a pore size distribution of the earth formation into the EOS; and solving, by the processor, the EOS to estimate the liquid and vapor molar fraction of components, liquid mole fraction, vapor mole fraction, liquid saturation, and vapor saturation of the mixture of hydrocarbons in the nano-pores in the earth formation.

Also disclosed is a system for estimating liquid and vapor molar fraction of components, liquid mole fraction, vapor mole fraction, liquid saturation, and vapor saturation of a mixture of hydrocarbons in nano-pores in an earth formation. The system includes a memory having computer-readable instructions and a processor for executing the computer-readable instructions. The computer-readable instructions include: constructing an equation of state (EOS) representing the mixture of hydrocarbons in the nano-pores in the earth formation; the EOS comprising a term accounting for capillary pressure in the nano-pores; inputting a composition of the mixture of hydrocarbons and a phase pressure of the hydrocarbons into the EOS; inputting a pore size distribution of the earth formation into the EOS; and solving the EOS to estimate the liquid and vapor molar fraction of components, liquid mole fraction, vapor mole fraction, liquid saturation, and vapor saturation of the mixture of hydrocarbons in the nano-pores in the earth formation.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

A conventional flash calculation is typically used to model the phase behavior of bulk fluids and applied to complex hydrocarbon systems in conventional oil/gas reservoirs without considering the reservoir rock pore size effects. Pore sizes in conventional reservoir rocks are usually larger than one micrometer. Under these circumstances, the effects of capillary pressure on phase equilibrium calculations can be neglected. Therefore, pore confinement effects on phase equilibrium conditions are regularly ignored in the prior art.

However, conventional flash calculations may not be applicable to porous media containing nanometer-size pores, such as those encountered in shale gas and/or oil reservoirs. As a result, the capillary pressure caused by the interfacial tension between the liquid and vapor phases in those small pores cannot be neglected. Capillary pressures alter the phase equilibrium of fluids in the nano-pore system. In one or more embodiments, the pore size can be in the range from 2 to 50 nm. The modeling of phase behavior of multi-component hydrocarbon systems in uniform pores has been investigated. However, the flash equilibrium model for fluids in uniform pores is not accurate enough to account for the phase behavior of fluids in the non-uniform pores normally encountered in real porous media.

To approach this problem, a multi-level iterative method is disclosed to solve the highly non-linear equation system of a novel phase equilibrium model, which includes capillary pressure and pore size distribution effects. A key factor of the disclosure resides in equalizing the thermodynamically calculated liquid saturation at a reservoir pressure and a reservoir temperature to that derived from the normalized cumulative pore size distribution being considered.

Research work has revealed that the liquid saturation and liquid mole fraction are significantly underestimated by the conventional flash calculation method at low pressures and low temperatures in the presence of nano-pores and heavy components in the porous media. Moreover, liquid saturation and liquid mole fraction are underestimated or overestimated when the assumed uniform or average pore size is not equal to the critical pore size of the porous media.

Figure 1:
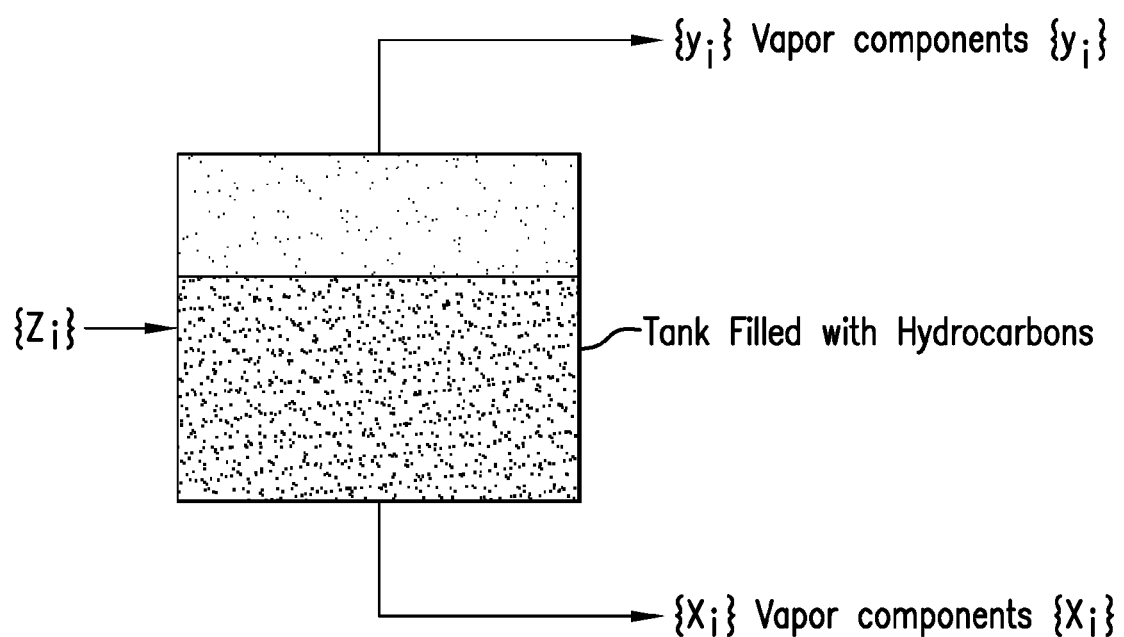
FIG. 1 depicts aspects of split phases of a bulk fluid given pressure, volume and temperature. which can be modeled by performing a flash calculation.

The mixture of hydrocarbon may split into vapor phase and liquid phase at certain temperature and pressure. Flash calculation can be performed to determine the yields of liquid and vapor, liquid and vapor molar fractions of components of the mixture of hydrocarbons, seen as FIG. 1, which illustrates split of phases of a bulk fluid having known pressure, volume and temperature (PVT) in a tank.

1. Introduction

The pores in the conventional reservoir rocks are large. The pore size is at least as large as a micron. Consequently, the capillary pressure between vapor phase and liquid phase is small and can be ignored. Therefore, the flash calculation for the bulk fluid is used for the fluids in conventional reservoirs. The flash calculation for the bulk fluid cannot be used for unconventional reservoirs. The pore sizes in the unconventional reservoir rocks can be in the order of a nanometer or nanometers. For the nano pores, the capillary pressure may be large and cannot be ignored. Therefore, new flash calculation methods need to be developed to take into account the capillary pressures in the nano pores.

2. Phase Equilibrium Models

The phase equilibrium model for the bulk fluid can be described by the following equation system:

$$z_i = n_l x_i + n_v y_i, i = 1, 2, \ldots, n_c \qquad (1)$$
$$x_i p \Phi_{l,i} = y_i p \Phi_{v,i}, i = 1, 2, \ldots, n_c$$
$$\sum_{i=1}^{n_c} x_i = \sum_{i=1}^{n_c} y_i = \sum_{i=1}^{n_c} z_i = 1$$
$$n_l + n_v = 1$$
$$p_v = p_l = p,$$

where $x_i$, $y_i$, $z_i$, $\Phi_{l,i}$, and $\Phi_{v,i}$ are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components. There is no capillary pressure in the tank. For the confined fluid in the nano-pores, the phase equilibrium model can be described as:

$$z_i = n_l x_i + n_v y_i, i = 1, 2, \ldots, n_c \qquad (2)$$
$$x_i p_l \Phi_{l,i} = y_i p_v \Phi_{v,i}$$
$$i = 1, 2, \ldots, n_c$$
$$p_v - p_l = p_c$$
$$\sum_{i=1}^{n_c} x_i = \sum_{i=1}^{n_c} y_i = \sum_{i=1}^{n_c} z_i = 1$$
$$n_l + n_v = 1$$

where $p_c$ is the capillary pressure. We can see that the capillary pressure is taken into the phase equilibrium equation. This phase equilibrium equation system can be solved for a particularly selected set.

The following provides a description of different alternatives that can be encountered in practice when solving the system of equations for the phase equilibrium model.

2.1 Known Liquid Phase Pressure and Known Vapor Phase Pressure

If the composition $\{z_i\}$, vapor phase pressure $p_v$, liquid phase pressure $p_l$ are known, the following equation system can be solved to determine the unknowns $n_v$, $n_l$, $\{x_i\}$, $\{y_i\}$, $p_c$.

$$z_i = n_l x_i + n_v y_i, i = 1, 2, \ldots, n_c \qquad (3)$$
$$x_i p_l \Phi_{l,i} = y_i p_v \Phi_{v,i}$$
$$i = 1, 2, \ldots, n_c$$
$$\sum_{i=1}^{n_c} x_i = \sum_{i=1}^{n_c} y_i = \sum_{i=1}^{n_c} z_i = 1$$
$$n_l + n_v = 1$$
$$p_c = p_v - p_l$$

2.2 Known Pore Size $r_c$

If the wettability, composition $\{z_i\}$, vapor phase pressure $p_v$ and pore radius $r_c$ are known, the following equation system can be solved to determine the unknowns $n_v$, $n_l$, $\{x_i\}$, $\{y_i\}$, $p_c$, $p_l$.

$$z_i = n_l x_i + n_v y_i, i = 1, 2, \ldots, n_c \qquad (4)$$
$$x_i p_l \Phi_{l,i} = y_i p_v \Phi_{v,i}$$
$$i = 1, 2, \ldots, n_c$$
$$p_v - p_l = p_c$$
$$p_c(s_l^*) = \frac{2\sigma \cos\theta}{r_c}, \sigma = \left[\sum_{i=1}^{n_c} (\text{Par})_i \left(\frac{x_i}{V_l} - \frac{y_i}{V_v}\right)\right]^4$$
$$\frac{n_l \bar{V}_l}{n_l \bar{V}_l + n_v \bar{V}_v} = s_l^*$$

$$\sum_{i=1}^{n_c} x_i = \sum_{i=1}^{n_c} y_i = \sum_{i=1}^{n_c} z_i = 1$$

$$n_l + n_v = 1$$

where $\overline{V}_l$ and $\overline{V}_v$ are vapor and liquid molar volume, respectively; and $\theta$ is the contact angle of the liquid-vapor interface. They are used to compute the saturation of the liquid phase, $s^*_l$.

2.3 Known Pore Size Distribution

For a given pore size distribution, contact angle $\theta$, composition $\{z_i\}$, and vapor phase pressure $p_v$, the following equation system can be solved to determine the unknowns $n_v$, $n_l$, $\{x_i\}$, $\{y_i\}$, $r_K$, $p_c$, and $p_l$. The difference between this case and the previous one is that the critical capillary radius, $r_K$, is unknown.

$$z_i = n_l x_i + n_v y_i, \ i = 1, 2, \dots, n_c \quad (5)$$

$$x_i p_l \Phi_{l,i} = y_i p_v \Phi_{v,i}$$

$$i = 1, 2, \dots, n_c$$

$$p_v - p_l = p_c$$

$$p_c(s^*_l) = \frac{2\sigma \cos\theta}{r_K}, \ \sigma = \left[\sum_{i=1}^{n_c} (\text{Par})_i \left(\frac{x_i}{\overline{V}_l} - \frac{y_i}{\overline{V}_v}\right)\right]^4$$

$$\frac{n_l \overline{V}_l}{n_l \overline{V}_l + n_v \overline{V}_v} = \frac{V^*_L}{V_T} = s^*_l$$

$$V^*_L = \sum_{r_j \leq r_K} V_j(r_j)$$

$$V_T = \sum_{r_j} V_j(r_j)$$

$$\sum_{i=1}^{n_c} x_i = \sum_{i=1}^{n_c} y_i = \sum_{i=1}^{n_c} z_i = 1$$

$$n_l + n_v = 1$$

where $s^*_l$ is liquid saturation, at which the phase equilibrium is reached. If the radius of a pore is smaller than $r_K$, it will be fully filled with the liquid. $\sigma$ is the interfacial tension at the interface between the vapor phase and liquid phase. $(\text{Par})_i$ is the parachor of component i. $V^*_L$ is the liquid volume in the total pore volume $V_T$ at which the phase equilibrium is reached.

2.4 Known $p_c$ Curve Measurement Data

For the given measured capillary pressure data, contact angle $\theta$, composition $\{z_i\}$, and vapor phase pressure $p_v$, the following equation system can be solved to determine the unknowns $n_v$, $n_l$, $\{x_i\}$, $\{y_i\}$, critical liquid saturation $s^*_l$, $p_c$, $p_l$.

$$z_i = n_l x_i + n_v y_i, \ i = 1, 2, \dots, n_c \quad (6)$$

$$x_i p_l \Phi_{l,i} = y_i p_v \Phi_{v,i}$$

$$i = 1, 2, \dots, n_c$$

$$p_v - p_l = p_c(s^*_l)$$

$$\frac{n_l \overline{V}_l}{n_l \overline{V}_l + n_v \overline{V}_v} = p_c^{-1} = s^*_l$$

$$\sum_{i=1}^{n_c} x_i = \sum_{i=1}^{n_c} y_i = \sum_{i=1}^{n_c} z_i = 1$$

$$n_l + n_v = 1$$

where $p_c(s_l)$ is the capillary pressure, which is the function of liquid saturation and $p_c^{-1}$ is the inverse function of capillary pressure.

3. Methods for Stability Test and Phase Equilibrium Calculation

The Peng-Robinson equation of state (EOS) is selected to model the phase behavior of the confined fluid. At certain pore pressure and temperature, the confined fluid may or may not split into two phases. The stability test can be performed to determine the potential phase split. Based on the stability test result, flash calculation can be performed to determine the yields of vapor phase and liquid phase, if phase split occurs.

3.1 Peng-Robinson Equation of Sate

Peng-Robinson EOS has a wider valid range, compared with other types of EOS. Therefore, it is used here to quantify the PVT properties of the confined fluid.

3.1.1 Vapor Phase

For the vapor phase of the fluid, Peng-Robinson EOS has the following form:

$$p_v = \frac{RT}{\overline{V}_v - b_v} - \frac{a_v}{\overline{V}_v(\overline{V}_v + b_v) + b_v(\overline{V}_v - b_v)} \quad (7)$$

where $a_v$ the attraction force coefficient of the vapor phase; $b_v$ is the co-volume of the vapor phase; T is temperature. The cubic equation for the gas phase compressibility factor is:

$$Z_v^3 - (1-B_v)Z_v^2 + (A_v - 3B_v^2 - 2B_v)Z_v - (A_v B_v - B_v^2 - B_v^3) = 0 \quad (8)$$

where $Z_v$ is the compressibility factor of the vapor phase. Parameters $A_v$ and $B_v$ are computed by:

$$A_v = \sum_{i=1}^{n_c} \sum_{j=1}^{n_c} y_i y_j A_{v,ij} \quad (9)$$

$$B_v = \sum_{i=1}^{n_c} y_i B_{v,i}$$

$$A_{v,ij} = (1 - k_{ij})\sqrt{A_{v,i} A_{v,j}}$$

$$A_{v,i} = \Omega_a \frac{p_{v,r,i}}{T_{r,i}^2} \alpha_i(T_{r,i})$$

$$B_{v,i} = \Omega_b \frac{p_{r,i}}{T_{r,i}} \alpha_i(T_{r,i})$$

$$\alpha_i(T_{r,i}) = \left[1 + m(\omega_i)\left(1 - \sqrt{T_{r,i}}\right)\right]^2$$

$$p_{v,r,i} = \frac{p_v}{P_{c,i}}$$

$$T_{r,i} = \frac{T}{T_{c,i}}$$

where $P_{c,i}$ and $T_{c,i}$ are the critical pressure and critical temperature of component i, respectively; $k_{l,j}$ is the binary interaction coefficient of components i and j; $\omega_i$ is the eccentric factor of component i. The fugacity coefficients of components in the vapor phase are computed by:

$$\ln\Phi_{v,i} = \frac{B_{v,i}}{B_v}(Z_v - 1) - \ln(Z_v - B_v) + \qquad (10)$$

$$\frac{A_v}{2\sqrt{2}\,B_v}\left(\frac{B_{v,i}}{B_v} - \frac{2}{A_v}\sum_{j=1}^{n}y_i A_{v,ij}\right)\ln\left[\frac{Z_v + (1+\sqrt{2})B_v}{Z_v + (1-\sqrt{2})B_v}\right]$$

$$\Phi_{v,j} = \frac{f_{v,i}}{y_i p_v},\ i = 1, 2, \ldots, n_c$$

where $f_{v,i}$ and $\Phi_{v,i}$ are the vapor phase fugacity and fugacity coefficient of component i, respectively. The EOS of the gas phase is:

$$p_v \overline{V}_v = Z_v RT \qquad (11)$$

where R is the real gas constant.

3.1.2 Liquid Phase

Peng-Robinson EOS of the liquid phase fluid is:

$$p_l = \frac{RT}{V_l - b_l} - \frac{a_l}{V_l(V_l + b_l) + b_l(V_l - b_l)} \qquad (12)$$

where $a_l$ the attraction force coefficient of the liquid phase; $b_l$ is the co-volume of the liquid phase. The cubic equation for the liquid phase compressibility factor is:

$$Z_l^3 - (1 - B_l)Z_l^2 + (A_l - 3B_l^2 - 2B_l)Z_l - (A_l B_l - B_l^2 - B_l^3) = 0 \qquad (13)$$

$$A_l = \sum_{i=1}^{n_c}\sum_{j=1}^{n_c} x_i x_j A_{l,ij} \qquad (14)$$

$$B_l = \sum_{i=1}^{n_c} x_i B_{l,i}$$

$$A_{l,ij} = (1 - k_{ij})\sqrt{A_{l,i}A_{l,j}}$$

$$A_{l,i} = \Omega_a \frac{p_{l,r,i}}{T_{r,i}^2}\alpha_i(T_{r,i})$$

$$B_{l,i} = \Omega_b \frac{p_{l,r,i}}{T_{r,i}}\alpha_i(T_{r,i})$$

$$\alpha_i(T_{r,i}) = \left[1 + m_i(\omega_i)\left(1 - \sqrt{T_{r,i}}\right)\right]^2$$

$$p_{l,r,i} = \frac{p_l}{P_{c,i}}$$

$$T_{r,i} = \frac{T}{T_{c,i}}$$

The fugacity coefficients of components in the liquid phase are computed by:

$$\ln\Phi_{l,i} = \frac{B_{l,i}}{B_l}(Z_l - 1) - \ln(Z_l - B_l) + \qquad (15)$$

$$\frac{A_l}{2\sqrt{2}\,B_l}\left(\frac{B_{l,i}}{B_l} - \frac{2}{A_l}\sum_{j=1}^{n}x_i A_{l,ij}\right)\ln\left[\frac{Z_l + (1+\sqrt{2})B_l}{Z_l + (1-\sqrt{2})B_l}\right]$$

$$\Phi_{l,i} = \frac{f_{l,i}}{x_i p_l},\ i = 1, 2, \ldots, n_c$$

where $f_{l,i}$ and $\Phi_{l,i}$ are the liquid phase fugacity and fugacity coefficient of component i, respectively. The EOS of the liquid phase is:

$$p_l \overline{V}_l = Z_l RT \qquad (16)$$

3.2 Stability Test

Next, a stability test is performed to identify phases and estimate the initial K-values for the flash calculation of the confined fluid. K is the ratio of vapor molar fraction $y_i$ to the liquid molar fraction $x_i$, i.e. $K_i = y_i/x_i$. The Gibbs energy of the mixture of hydrocarbons is computed by:

$$G_z = \sum_{i=1}^{n_c} n_i \mu_{z,i} = n\sum_{i=1}^{n_c} z_i \mu_{z,i} \qquad (17)$$

The Gibbs energy for n moles of mixture of hydrocarbons in two phases is calculated by:

$$G_z = \sum_{i=1}^{n_c}[n_{v,i}\mu_{v,i} + n_{l,i}\mu_{l,i}] \qquad (18)$$

$$\mu_{v,i} = \mu_{l,i} = \mu_i,\ i = 1, 2, \ldots, n_c$$

$$G_z = n\sum_{i=1}^{n_c}[n_v y_i \mu_{v,i} + n_l x_i \mu_{l,i}] \qquad (19)$$

$$= n\sum_{i=1}^{n_c}[n_v y_i + n_l x_i]\mu_i$$

Figure 2A:
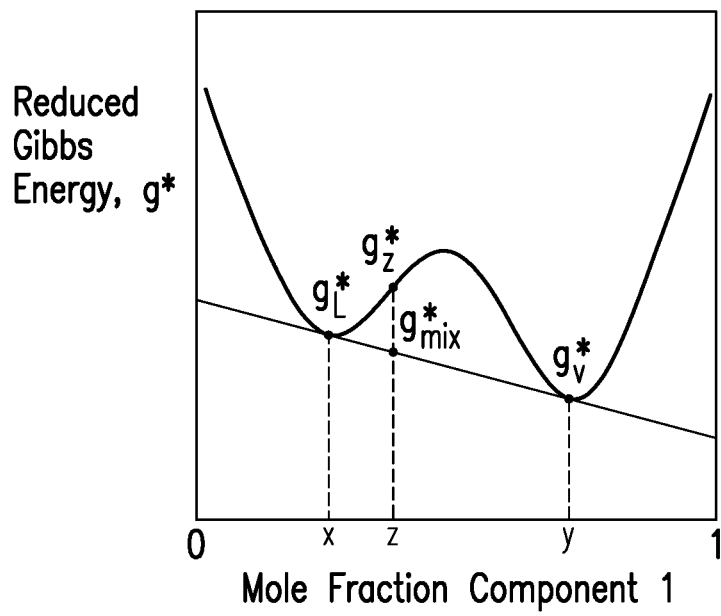
FIGS. 2A and 2B, collectively referred to a FIG. 2, depict aspects of the Gibbs energy function for a multi-component hydrocarbon fluid and mole number sums for a stability test.
Figure 2B:
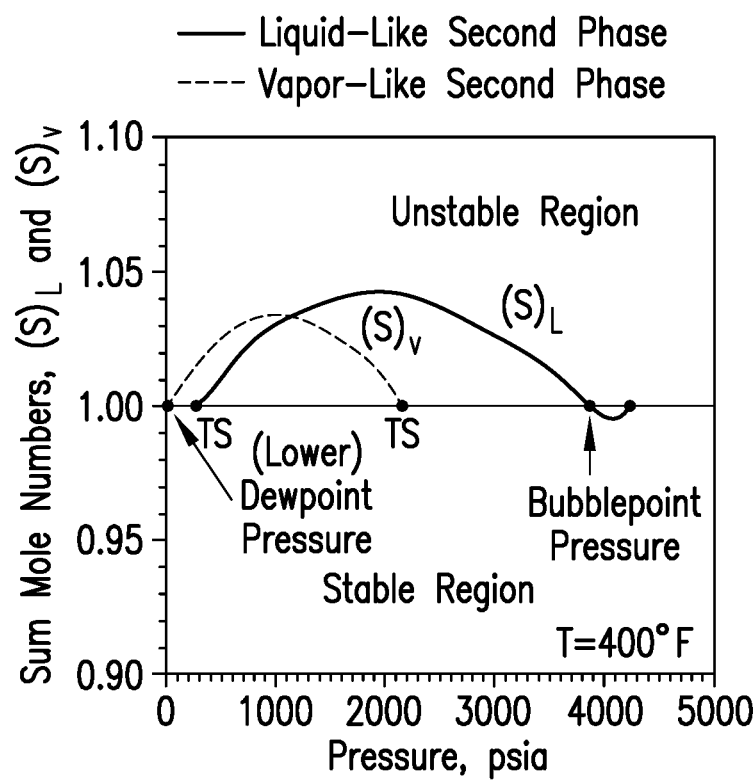

The normalized Gibbs energy function is defined as:

$$g^* = \frac{G_z}{RT} = \sum_{i=1}^{n_c} z_i \ln f_i \qquad (20)$$

$$f_i = z_i p \Phi_i$$

$$Z^3 - (1 - B)Z^2 + (A - 3B^2 - 2B)Z - (AB - B^2 - B^3) = 0 \qquad (21)$$

$$A = \sum_{i=1}^{n_c}\sum_{j=1}^{n_c} z_i z_j A_{i,j} \qquad (22)$$

$$B = \sum_{i=1}^{n_c} z_i B_i$$

$$A_{ij} = (1 - k_{ij})\sqrt{A_i A_j}$$

$$A_i = \Omega_a \frac{p_{r,i}}{T_{r,i}^2}\alpha_i(T_{r,i})$$

$$B_i = \Omega_b \frac{p_{r,i}}{T_{r,i}}\alpha_i(T_{r,i})$$

$$\alpha_i(T_{r,i}) = \left[1 + m_i(\omega_i)\left(1 - \sqrt{T_{r,i}}\right)\right]^2$$

$$p_{r,i} = \frac{p}{P_{c,j}}$$

$$T_{r,i} = \frac{T}{T_{c,i}}$$

$$\ln\Phi_i = \frac{B_i}{B}(Z - 1) - \ln(Z - B) + \qquad (23)$$

$$\frac{A}{2\sqrt{2}\,B}\left(\frac{B_i}{B} - \frac{2}{A}\sum_{j=1}^{n}z_i A_{ij}\right)\ln\left[\frac{Z + (1+\sqrt{2})B}{Z + (1-\sqrt{2})B}\right]$$

$$f_i = z_i p \Phi_i,\ i = 1, 2, \ldots, n_c$$

where $f_i$ and $\Phi_i$ are fugacity and fugacity coefficient of component i of the mixture of hydrocarbons, respectively. The root of the EOS is the Z which has the minimum normalized Gibbs energy function (see FIG. 2). The procedure for the stability test is given in the following:

Step 1: compute the initial K-values for the mixture of hydrocarbons with Wilson's formula and set iteration counter m=0

$$(K_i)_v^{(0)} = (K_i)_l^{(0)} = \frac{P_{c,i}}{p} e^{5.37(1+\omega_i)\left(1-\frac{T_{c,i}}{T}\right)}, i = 1, 2, \ldots, n_c \quad (24)$$

Step 2: compute mole numbers of components of vapor-like fluid and liquid-like fluid $$(Y_i)_v^{(m+1)} = z_i (K_i)_v^{(m)}, i = 1, 2, \ldots, n_c \quad (25)$$

$$(Y_i)_l^{(m+1)} = \frac{z_i}{(K_i)_l^{(m)}}, i = 1, 2, \ldots, n_c \quad (26)$$

Step 3: compute sums of mole numbers of the vapor-like fluid and liquid-like fluid $$S_v^{(m+1)} = \sum_{i=1}^{n_c} (Y_i)_v^{(m+1)} \quad (27)$$

$$S_l^{(m+1)} = \sum_{i=1}^{n_c} (Y_i)_l^{(m+1)} \quad (28)$$

Step 4: compute molar fractions of components of the vapor-like fluid and liquid-like fluid, respectively $$(y_i)_v^{(m+1)} = \frac{\sum_{i=1}^{n_c}(Y_i)_v^{(m+1)}}{S_v^{(m+1)}} \quad (29)$$

$$(y_i)_l^{(m+1)} = \frac{\sum_{i=1}^{n_c}(Y_i)_l^{(m+1)}}{S_l^{(m+1)}}, \quad (30)$$

Step 5: compute fugacity coefficients of the vapor-like fluid and liquid-like fluid, respectively $$\ln(\Phi_i)_v^{(m+1)} = \frac{B_{v,i}}{B_v}(Z_v - 1) - \ln(Z_v - B_v) + \quad (31)$$

$$\frac{A_v}{2\sqrt{2}B_v}\left[\frac{B_{v,i}}{B_v} - \frac{2}{A_v}\sum_{j=1}^{n}(y_i)_v A_{v,ij}\right] \ln\left[\frac{Z_v + (1+\sqrt{2})B_v}{Z_v + (1-\sqrt{2})B_v}\right]$$

$$(f_i)_v^{(m+1)} = (y_i)_v^{(m+1)} p (\Phi_i)_v^{(m+1)}, i = 1, 2, \ldots, n_c$$

$$(\Phi_i)_l^{(m+1)} = \frac{B_{l,i}}{B_l}(Z_v - 1) - \ln(Z_l - B_l) + \quad (32)$$

$$\frac{A_l}{2\sqrt{2}B_l}\left[\frac{B_{l,i}}{B_l} - \frac{2}{A_l}\sum_{j=1}^{n}(y_i)_l A_{l,ij}\right] \ln\left[\frac{Z_l + (1+\sqrt{2})B_l}{Z_l + (1-\sqrt{2})B_l}\right]$$

$$(f_i)_l^{(m+1)} = (y_i)_l^{(m+1)} p (\Phi_i)_l^{(m+1)}, i = 1, 2, \ldots, n_c$$

For the vapor-like fluid, the root of EOS is the maximum $Z_{v,max}$.

$$Z_v^3 - (1 - B_v)Z_v^2 + (A_v - 3B_v^2 - 2B_v)Z_v - (A_v B_v - B_v^2 - B_v^3) = 0 \quad (33)$$

$$A_v = \sum_{i=1}^{n_c}\sum_{j=1}^{n_c}(y_i)_v^{(m+1)}(y_j)_v^{(m+1)} A_{v,i,j} \quad (34)$$

$$B_v = \sum_{i=1}^{n_c}(y_i)_v^{(m)} B_{v,i}$$

$$A_{v,ij} = (1 - k_{ij})\sqrt{A_{v,i}A_{v,j}}$$

$$A_{v,i} = \Omega_a \frac{p_{r,i}}{T_{r,i}^2}\alpha_i(T_{r,i})$$

$$B_{v,i} = \Omega_b \frac{p_{r,i}}{T_{r,i}}\alpha(T_{r,i})$$

$$\alpha_i(T_{r,i}) = \left[1 + m_i(\omega_i)\left(1 - \sqrt{T_{r,i}}\right)\right]^2$$

$$p_{r,i} = \frac{p_v}{P_{c,i}}$$

$$T_{r,i} = \frac{T}{T_{c,i}}$$

For the liquid-like fluid, the root of EOS is the minimum $Z_{l,min}$.

$$Z_l^3 - (1 - B_l)Z_l^2 + (A_l - 3B_l^2 - 2B_l)Z_l - (A_l B_l - B_l^2 - B_l^3) = 0 \quad (35)$$

$$A_l = \sum_{i=1}^{n_c}\sum_{j=1}^{n_c}(y_i)_l^{(m+1)}(y_j)_l^{(m+1)} A_{l,i,j} \quad (36)$$

$$B_l = \sum_{i=1}^{n_c}(y_i)_l^{(m+1)} B_{l,i}$$

$$A_{l,ij} = (1 - k_{ij})\sqrt{A_{l,i}A_{l,j}}$$

$$A_{i,i} = \Omega_a \frac{p_{r,i}}{T_{r,i}^2}\alpha_i(T_{r,i})$$

$$B_{i,i} = \Omega_b \frac{p_{r,i}}{T_{r,i}}\alpha_i(T_{r,i})$$

$$\alpha_i(T_{r,i}) = \left[1 + m_i(\omega_i)\left(1 - \sqrt{T_{r,i}}\right)\right]^2$$

$$p_{r,i} = \frac{p_l}{P_{c,i}}$$

$$T_{r,i} = \frac{T}{T_{c,i}}$$

Step 6: compute K-values of the vapor-like fluid and liquid-like fluid $$(K_i)_l^{(m+1)} = (K_i)_l^{(m)} (R_i)_l^{(m+1)} \quad (37)$$

$$(K_i)_v^{(m+1)} = (K_i)_v^{(m)} (R_i)_v^{(m+1)}$$

$$(R_i)_l^{(m+1)} = \frac{(f_{y_i})_l^{(m+1)}}{f_{z_i}} S_l^{(m+1)} \quad (38)$$

$$(R_i)_v^{(m+1)} = \frac{f_{z_i}}{(f_{y_i})_v^{(m+1)}} \frac{1}{S_v^{(m+1)}}$$

Step 7: check convergence if $$\sum_{i=1}^{n_c}\left[(R_i)_l^{(m+1)} - 1\right]^2 < \varepsilon \quad (39)$$

$$\sum_{i=1}^{n_c}\left[(R_i)_v^{(m+1)} - 1\right]^2 < \varepsilon$$

stop iteration ($\varepsilon = 10^{-12}$).

Step 8: check trivial solution if $$\sum_{i=1}^{n_c} \ln[(K_i)_l^{(m+1)}]^2 < \varepsilon \qquad (40)$$

$$\sum_{i=1}^{n_c} \ln[(K_i)_v^{(m+1)}]^2 < \varepsilon$$

stop iteration (e.g., $\varepsilon=10^{-4}$).
Step 9: update iteration number from m to m+1
Step 10: go to step 2.

3.3 Phase Equilibrium Calculation

With the given phase pressures $p_v$, $p_l$, composition $\{z_i\}$, and contact angle $\theta$, there are $2n_c+2$ unknowns need to be determined. To simply the solution process, the mole fractions ($n_v$ and $n_l$) of phases and molar fractions of components of phases are determined separately, by assuming the K-values of components.

3.3.1 Known $K_i$

The phase equilibrium ratio K value for the confined fluid is defined as:

$$K_i = \frac{y_i}{x_i} = \frac{p_l \Phi_{l,i}}{p_v \Phi_{v,i}}, i = 1, 2, \ldots, n_c \qquad (41)$$

$$y_i = K_i x_i, i = 1, 2, \ldots, n_c \qquad (42)$$

From Eq. (2), the following can be derived:

$$x_i = \frac{z_i}{n_l + (1-n_l)K_i}, i = 1, 2, \ldots, n_c \qquad (43)$$

$$y_i = \frac{K_i z_i}{n_l + (1-n_l)K_i}, i = 1, 2, \ldots, n_c$$

$$\sum_{i=1}^{n_c} x_i - \sum_{i=1}^{n_c} y_i = 0 \qquad (44)$$

Substitute Eq. (43) into Eq. (44), to obtain:

$$f(n_l, z_1, \ldots, z_{n_c}, K_1, \ldots, K_{n_c}) = \sum_{i=1}^{n_c} \frac{(1-K_i)z_i}{n_l + (1-n_l)K_i} = 0 \qquad (45)$$

The derivative of the left hand side of Eq. (45) is:

$$f'(n_l, z_1, \ldots, z_{n_c}, K_1, \ldots, K_{n_c}) = -\sum_{i=1}^{n_c} \frac{(1-K_i)^2 z_i}{[n_l + (1-n_l)K_i]^2} \qquad (46)$$

Eq. (45) can be solved with the Newton iteration method. The initial guess of $n_l$ can be calculated by:

$$n_l^{(0)} = \frac{\sum_{i=1}^{n_c} z_i(K_i-1)/K_i}{\sum_{i=1}^{n_c} z_i(K_i-1)/K_i - \sum_{i=1}^{n_c} z_i(K_i-1)}, \qquad (47)$$

The iterative solution of $n_l$ is:

$$n_l^{(n+1)} = n_l^{(n)} - \frac{f(n_l^{(n)}, z_1, \ldots, z_{n_c}, K_1, \ldots, K_{n_c})}{f'(n_l^{(n)}, z_1, \ldots, z_{n_c}, K_1, \ldots, K_{n_c})}, \qquad (48)$$

where n is the iteration number for flash calculation (calculation of $n_l$, $n_v$, $x_i$, $y_i$, $i=1, 2, \ldots, n_c$).
The convergent solution of $n_l$ is $n^*_l$. The convergent solution of $n_v$ is $n^*_v$, and $$n^*_v = 1 - n^*_l \qquad (49)$$

The convergent solutions of liquid and vapor molar fractions are:

$$x_i^* = \frac{z_i}{n_l^* + (1-n_l^*)K_i}, i = 1, 2, \ldots, n_c \qquad (50)$$

$$y_i^* = \frac{K_i z_i}{n_l^* + (1-n_l^*)K_i}, i = 1, 2, \ldots, n_c$$

3.3.2 Unknown $K_i$

If K-values of components are unknown, then the flash calculation can be performed to iteratively solve the phase equilibrium equations of components using two imbedded loops. The initial K-values can be estimated with the Wilson's correlation:

$$K_i^{(0)} = \frac{P_{c,i}}{p^{(k,0)}} e^{5.37(1+\omega)\left(1-\frac{T_{c,i}}{T}\right)}, i = 1, 2, \ldots, n_c \qquad (51)$$

The iterative solution of K-values is computed by:

$$K_i^{(m)} = \frac{y_i^{(m)}}{x_i^{(m)}} = \frac{p_l^{(m)} \Phi_{l,i}^{(m)}}{p_v \Phi_{v,i}^{(m)}}, i = 1, 2, \ldots, n_c \qquad (52)$$

where m is the iteration number for K-value calculation. The equation for solving the mole fractions of vapor and liquid phase at mth iterative solution of K-values is:

$$f(n_l^{(m+1)}, z_1, \ldots, z_{n_c}, K_1^{(m)}, \ldots, K_{n_c}^{(m)}) = \qquad (53)$$
$$\sum_{i=1}^{n_c} \frac{(1-K_i^{(m)})z_i}{n_l^{(m+1)} + (1-n_l^{(m+1)})K_i^{(m)}} = 0$$

The derivative of Eq. (53) is:

$$f'(n_l^{(m+1)}, z_1, \ldots, z_{n_c}, K_1^{(m)}, \ldots, K_{n_c}^{(m)}) = \qquad (54)$$
$$-\sum_{i=1}^{n_c} \frac{(1-K_i^{(m)})^2 z_i}{[n_l^{(m+1)} + (1-n_l^{(m+1)})K_i^{(m)}]^2}.$$

Similarly, Eq. (53) can be solved in the Newton's method. The initial guess value of liquid mole fraction can be estimated by:

$$n_l^{(m+1,0)} = \frac{\sum_{i=1}^{n_c} z_i(K_i^{(m)} - 1)/K_i^{(m)}}{\sum_{i=1}^{n_c} z_i(K_i^{(m)} - 1)/K_i^{(m)} - \sum_{i=1}^{n_c} z_i(K_i^{(m)} - 1)}, \quad (55)$$

The iterative solution of liquid mole fraction is computed by:

$$n_l^{(m+1,n+1)} = n_l^{(m+1,n)} - \frac{f(n_l^{(m+1,n)}, z_1, \ldots, z_{n_c}, K_1^{(m)}, \ldots, K_{n_c}^{(m)})}{f'(n_l^{(m+1,n)}, z_1, \ldots, z_{n_c}, K_1^{(m)}, \ldots, K_{n_c}^{(m)})}, \quad (56)$$

The convergent solution at K-values $K_i^{(m^*)}$, $i=1, 2, \ldots, n_c$, and the correspond solutions of mole fractions of vapor phase and liquid phase, and molar fractions of components in liquid phase and vapor phase are:

$$n_v^* = 1 - n_l^{(m^*,n^*)} \quad (57)$$
$$n_l^* = n_l^{(m^*,n^*)}$$
$$x_i^* = \frac{z_i}{n_l^* + (1 - n_l^*)K_i^{(m^*)}}, \quad i = 1, 2, \ldots, n_c$$
$$y_i^* = \frac{K_i^{(m^*)} z_i}{n_l^* + (1 - n_l^*)K_i^{(m^*)}}, \quad i = 1, 2, \ldots, n_c$$

4. Algorithms for Flash Calculation of Confined Fluids

The following algorithms are presented to automatically identify the phase split and perform flash calculation of the confined fluid at the four given conditions.

4.1 Known Liquid and Vapor Phase Pressures

Two-loop iteration algorithm is design to perform vapor-liquid equilibrium (VLE) calculation to determine K-values and mole fractions of phases.

Step 1: obtain the input parameters contact angle $\theta$, composition $\{z_i\}$, vapor phase pressure $p_v$, liquid phase pressure $p_l$ ($p_v \geq p_l$), temperature T.
Step 2: set iteration counter m=0.
Step 3: initialize K-values with Eq. (51).
Step 4: set iteration counter n=0.
Step 5: initialize liquid mole fraction $n_l^{(m+1,0)}$ with Eq. (58)

$$n_l^{(m+1,0)} = \frac{\sum_{i=1}^{n_c} z_i(K_i^{(m)} - 1)/K_i^{(m)}}{\sum_{i=1}^{n_c} z_i(K_i^{(m)} - 1)/K_i^{(m)} - \sum_{i=1}^{n_c} z_i(K_i^{(m)} - 1)}, \quad (58)$$

Step 6: compute liquid mole fraction $n_l^{(m+1,n+1)}$ with Eq. (56).
Step 7: check convergence of solution for Eq. (53). If $$f(n_l^{(m+1,n+1)}, z_1, \ldots, z_{n_c}, K_1^{(m)}, \ldots, K_{n_c}^{(m)}) < \varepsilon, \quad (59)$$

stop iteration and go to step 10.
Step 8: update iteration counter n with n+1.
Step 9: go to step 6.
Step 10: update K-values, mole fractions, and molar fractions:

$$n_v^{(m+1)} = 1 - n_l^{(m+1,n+1)} \quad (60)$$
$$n_l^{(m+1)} = n_l^{(m+1,n+1)}$$
$$x_i^{(m+1)} = \frac{z_i}{n_l^{(m+1,n+1)} + (1 - n_l^{(m+1,n+1)})K^{(m)}}, \quad i = 1, 2, \ldots, n_c$$
$$y_i^{(m+1)} = \frac{K_i^{(m)} z_i}{n_l^{(m+1,n+1)} + (1 - n_l^{(m+1,n+1)})K^{(m)}}, \quad i = 1, 2, \ldots, n_c$$
$$K_i^{(m+1)} = \frac{y_i^{(m+1)}}{x_i^{(m+1)}}, \quad i = 1, 2, \ldots, n_c$$
$$\Phi_{v,i}^{(m+1)} = \Phi_{v,i}^{(m+1,n+1)}, \quad i = 1, 2, \ldots, n_c$$
$$\Phi_{l,i}^{(m+1)} = \Phi_{l,i}^{(m+1,n+1)}, \quad i = 1, 2, \ldots, n_c$$

Step 11: check convergence of solution. If $$\sum_{i=1}^{n_c} \left\{ \frac{(f_i)_v^{(m+1)}}{(f_i)_v^{(m+1)}} - 1 \right\}^2 < \varepsilon \quad (61)$$

$$(f_i)_v^{(m+1)} = y_i^{(m+1)} p_v \Phi_{v,i}^{(m+1)}$$
$$(f_i)_l^{(m+1)} = x_i^{(m+1)} p_l \Phi_{l,i}^{(m+1)}$$

finalize the solution with Eq. (62) and exit.

$$n_l = n_l^{(m+1)} \quad (62)$$
$$n_v = 1 - n_l^{(m+1)}$$
$$x_i = \frac{z_i}{n_l^{(m+1)} + (1 - n_l^{(m+1)})K^{(m+1)}}, \quad i = 1, 2, \ldots, n_c$$
$$y_i = \frac{K_i^{(m+1)} z_i}{n_l^{(m+1)} + (1 - n_l^{(m+1)})K^{(m+1)}}, \quad i = 1, 2, \ldots, n_c$$
$$K_i = \frac{y_i}{x_i}, \quad i = 1, 2, \ldots, n_c$$
$$s_l = \frac{n_l \bar{V}_l}{n_l \bar{V}_l + n_v \bar{V}_v}$$
$$s_v = 1 - s_l$$

Step 12: update iteration counter m with m+1.
Step 13: go to step 4.

Figure 3:
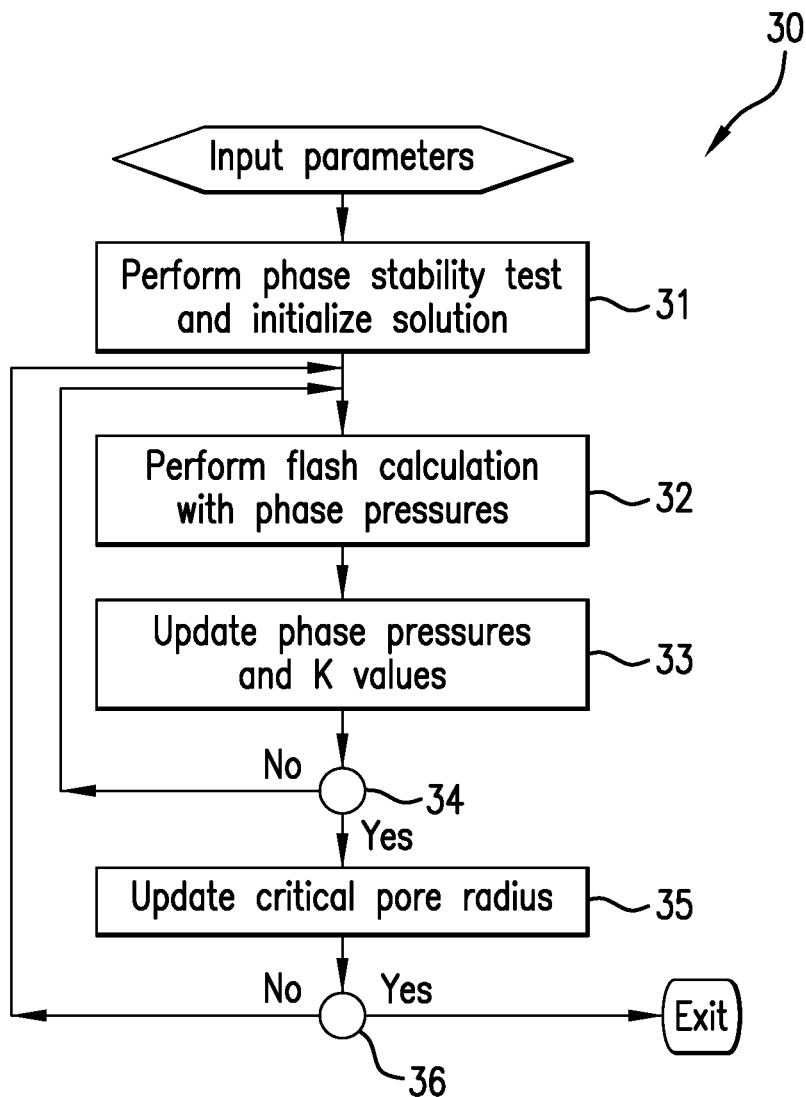
FIG. 3 depicts aspects of a novel multi-level iterative solution for the flash calculation of hydrocarbons confined in shale rock, which has a measured pore size distribution or a capillary pressure curve.

This iterative algorithm is the inner loop, noted as the second computation box 32, of the multi-level iterative solution method 30 illustrated in FIG. 3 used to solve the phase equilibrium model for the hydrocarbons confined in a shale rock with a known pore size distribution or the known $p_c$ data.

4.2 Known Pore Size

Three loops are designed to solve Eq. (4) to obtain the flash calculation results. In this calculation there is only one pore size. The outer most loop is used to determine the capillary pressure. The mid-loop is for determining the K-values for the given liquid and vapor phase pressures. The inner most loop is for solving the vapor mole fractions $n_v$ and $n_l$. The mid- and inner most loops are integrated for the VLE calculation, described in section 4.1.

Step 1: Obtain the input parameters contact angle $\theta$, $\{z_i\}$, p, T, $r_c$.
Step 2: Identify fluid type with phase envelope and critical point ($T_c, P_c$).

Step 3: If $T<T_c$, it is oil type fluid and fix liquid phase pressure:

$$ITYPE=1$$

$$p_l=p \quad (63)$$

Step 4: If $T>T_c$, it is gas type fluid and fix vapor phase pressure:

$$ITYPE=2$$

$$p_v=p \quad (64)$$

Step 5: Perform the stability test using procedure described in section 3.2 with given composition $\{z_i\}$ and p, assuming $p_v=p_l=p$.

Step 6: If there is a trivial solution $S_v=0$ and $S_l=0$, or $S_v=0$ and $S_l<0.95$, or $S_v<0.95$ and $S_l=0$, no phase split. Finalize the solution with Eq. (65) or Eq. (66) and exit.

For oil type fluid:

$$x_i=z_i, i=1,2,\ldots,n_c$$

$$y_i=0, i=1,2,\ldots,n_c$$

$$n_l=1$$

$$n_v=0$$

$$s_l=1$$

$$s_v=0 \quad (65)$$

For gas type fluid:

$$x_i=0, i=1,2,\ldots,n_c$$

$$y_i=z_i, i=1,2,\ldots,n_c$$

$$n_l=0$$

$$n_v=1$$

$$s_l=0$$

$$s_v=1 \quad (66)$$

Step 7: If $S_v=0$ and $0.95<=S_l<1$, there is potential capillary condensation. Or else go to step 17.
Step 8: set iteration counter m=0.
Step 9: Initialize K-values and liquid phase pressure with stability test results for flash calculation.

$$(K_i)^{(0)}=(K_i)_l^{(M)}, i=1,2,\ldots,n_c$$

$$p_l^{(0)}=\max(p-(K_1)^{(M)}p/10^3, p_{l,min}) \quad (67)$$

Step 10: Perform flash calculation with the algorithm described in section 4.1 with the initial guess value $n_l=0$.
Step 11: If there is no solution for Eq. (53), finalize the solution with Eq. (66) and exit.
Step 12: Update iteration counter m with m+1.
Step 13: update liquid phase pressure with $$p_c^{(m+1)} = \frac{2\sigma\cos\theta}{r_c}, \sigma = \sum_{i=1}^{n_c}\left[(Par)_i\left(\frac{x_i^{(m)}}{V_l^{(m)}} - \frac{y_i^{(m)}}{V_v^{(m)}}\right)\right]^4 \quad (68)$$

$$p_l^{(m+1)} = \max(p - p_c^{(m+1)}, p_{l,min})$$

Step 14: Perform flash calculation with the algorithm described in section 4.1 with the updated liquid phase pressure.

Step 15: If $|n_l^{(m+1)}-n_l^{(m)}|<\varepsilon$, stop iteration and exit.
Step 16: Go to step 12.
Step 17: If $0.95<=S_v<1$ and $S_l=0$, there is a potential bubble point suppression, or else go to step 27.
Step 18: set iteration counter m=0.
Step 19: initialize K-values and vapor phase pressure with stability test result for flash calculation.

$$(K_i)^{(0)}=(K_i)_l^{(M)}, i=1,2,\ldots,n_c$$

$$p_v^{(0)}=p+(K_1)^{(M)}p/10^3 \quad (69)$$

Step 20: Perform flash calculation with the algorithm described in section 4.1 with the initial guess value $n_l=1$.
Step 21: If there is no solution for Eq. (53), finalize the solution with Eq. (65) and exit.
Step 22: Update iteration counter m with m+1.
Step 23: update vapor phase pressure with $$p_c^{(m+1)} = \frac{2\sigma\cos\theta}{r_c}, \sigma = \sum_{i=1}^{n_c}\left[(Par)_i\left(\frac{x_i^{(m)}}{V_l^{(m)}} - \frac{y_i^{(m)}}{V_v^{(m)}}\right)\right]^4 \quad (70)$$

$$p_l^{(m+1)} = p + p_c^{(m+1)}$$

Step 24: Perform flash calculation with the algorithm described in section 4.1 with the updated liquid phase pressure.
Step 25: If $|n_l^{(m+1)}-n_l^{(m)}|<\varepsilon$, stop iteration and exit.
Step 26: go to step 22.
Step 27: If $S_v=0$ and $S_l>=1$, there is liquid-like fluid, and initial K-value for flash calculation is $$(K_i)^{(0)}=(K_i)_l^{(M)}, i=1,2,\ldots,n_c \quad (71)$$

where $(K_i)_l^{(M)}$ are the convergent solutions of K-Values for liquid-like fluid from stability test.

Step 28: If $S_v>=1$ and $S_l=0$, there is vapor-like fluid, and initial K-value for flash calculation is $$(K_i)^{(0)}=(K_i)_l^{(M)}(K_i)_v^{(M)}, i=1,2,\ldots,n_c \quad (72)$$

where $(K_i)_v^{(m)}$ are the convergent solutions of K-Values for vapor like fluid from stability test. Step 29: If $S_v>=1$ and $S_l>=1$, there is phase split, and initial K-value for flash calculation is $$(K_i)^{(0)}=(K_i)_l^{(M)}(K_i)_v^{(M)}, i=1,2,\ldots,n_c \quad (73)$$

Step 30: set iteration counter m=0.
Step 31: initialize vapor or liquid phase pressure with stability test result for flash calculation.

$$p_v^{(0)}=p+(K_i)^{(0)}p/10^3, \text{ for oil type fluid}$$

$$p_l^{(0)}=\max(p-(K_i)^{(0)}p/10^3, p_{l,min}), \text{ for gas type fluid} \quad (74)$$

Step 32: Perform flash calculation with the algorithm described in section 4.1.
Step 33: If there is no solution for Eq. (53), finalize the solution with Eq. (65) or Eq. (66) and exit.
Step 34: Update iteration counter m with m+1.
Step 35: update vapor phase pressure with $$p_c^{(m+1)} = \frac{2\sigma\cos\theta}{r_c}, \sigma = \sum_{i=1}^{n_c}\left[(Par)_i\left(\frac{x_i^{(m)}}{V_l^{(m)}} - \frac{y_i^{(m)}}{V_v^{(m)}}\right)\right]^4 \quad (75)$$

-continued $$p_v^{(m+1)} = p + p_c^{(m+1)}, \text{ for oil type fluid}$$

$$p_l^{(m+1)} = \max(p - p_c^{(m+1)}, p_{l,min}), \text{ for gas type fluid}$$

Step 36: Perform flash calculation with the algorithm described in section 4.1 with the updated liquid or vapor phase pressure.
Step 37: If $|n_l^{(m+1)} - n_l^{(m)}| < \varepsilon$, stop iteration and exit.
Step 38: go to step 34.

This iterative algorithm is illustrated as the inner loop (second computation box 32) and the middle loop (computation boxes 32-33 and first checkpoint 34) of the of the multi-level iterative solution method 30 illustrated in FIG. 3 used to solve the phase equilibrium model for the hydrocarbons confined in a shale rock with a known pore size distribution or the known $p_c$ data. The first checkpoint 34 relates to determining if a convergent solution is identified.

4.3 Known Pore Size Distribution

Four loops are designed to solve Eq. (5) to obtain the flash calculation results. The loops are counted from the outer most to the inner most. The first loop is designed to determine the critical pore size. The second loop is used for determine the capillary pressure, corresponding to the given pore size. The third loop is used to determine for the K-values, corresponding to the given pore size, liquid and vapor phase pressure. The fourth loop is for solving the vapor mole fractions $n_v$ and $n_l$, corresponding to the given pore size, K-values, liquid and vapor phase pressure. The third and fourth loops are integrated for the VLE calculation, described in section 4.1

Step 1: Obtain the input parameters $\theta$, $\{z_i\}$, p, T, $\{r_j\}$.
Step 2: Identify fluid type with phase envelope and critical point $(T_c, P_c)$.
Step 3: If $T < T_c$, it is oil type fluid and fix liquid phase pressure.
Step 4: If $T > T_c$, it is gas type fluid and fix vapor phase pressure.
Step 5: Sort the pore size sequence and arrange the sequence from the smallest pore to the largest pore.
Step 6: Generate liquid saturation vs. pore size table with sorted pore size sequence:

$$s_l(r) = \frac{V_L}{V_T} = \frac{\sum_{r_j \leq r} V_j(r_j)}{\sum_{r_j} V_j(r_j)} \tag{76}$$

where $V_j(r_j)$ is the pore volume of the jth pore.
If the pores are spheres, $$V_j(r_j) = \frac{4}{3}\pi r_j^3 \tag{77}$$

Step 7: set iteration counter k=0.
Step 8: Initialize critical pore radius $r_K^{(0)}$.
Step 9: If k=0, perform the stability test using procedure described in section 3.2 with given composition $\{z_i\}$ and p, assuming $p_v = p_l = p$.
Step 10: If there is a trivial solution $S_v = 0$ and $S_l = 0$, or $S_v = 0$ and $S_l < 0.95$, or $S_v < 0.95$ and $S_l = 0$, no phase split. Finalize the solution with Eq. (65) or Eq. (66) and exit.

Step 11: If $S_v = 0$ and $0.95 \leq S_l < 1$, there is potential capillary condensation. Or else go to step 21.
Step 12: set iteration counter m=0.
Step 13: Initialize K-values and liquid phase pressure with stability test result for flash calculation, using Eq. (67).
Step 14: Perform flash calculation with the algorithm described in section 4.1 with the initial guess value $n_l = 0$.
Step 15: If there is no solution for Eq. (53), finalize the solution with Eq. (66) and exit.
Step 16: Update iteration counter m with m+1.
Step 17: update liquid phase pressure with $$p_c^{(k,m+1)} = \frac{2\sigma \cos\theta}{r_K^{(k)}}, \sigma = \sum_{i=1}^{n_c} \left[ (Par)_i \left( \frac{x_i^{(k,m)}}{V_l^{(k,m)}} - \frac{y_i^{(k,m)}}{V_v^{(k,m)}} \right) \right]^4 \tag{78}$$

$$p_l^{(k,m+1)} = \max(p - p_c^{(k,m+1)}, p_{l,min})$$

Step 18: Perform flash calculation with the algorithm described in section 4.1 with the updated liquid phase pressure.
Step 19: If $|n_l^{(k,m+1)} - n_l^{(k,m)}| < \varepsilon$, stop iteration and go to step 43.
Step 20: Go to step 16.
Step 21: If $0.95 \leq S_v < 1$ and $S_l = 0$, there is a potential bubble point suppression, or else go to step 31.
Step 22: set iteration counter m=0.
Step 23: initialize K-values and vapor phase pressure with stability test result for flash calculation, using Eq. (69).
Step 24: Perform flash calculation with the algorithm described in section 4.1 with the initial guess value $n_l = 1$.
Step 25: If there is no solution for Eq. (53), finalize the solution with Eq. (65) and exit.
Step 26: Update iteration counter m with m+1.
Step 27: update vapor phase pressure with $$p_c^{(k,m+1)} = \frac{2\sigma \cos\theta}{r_K^{(k)}}, \sigma = \sum_{i=1}^{n_c} \left[ (Par)_i \left( \frac{x_i^{(k,m)}}{V_l^{(k,m)}} - \frac{y_i^{(k,m)}}{V_v^{(k,m)}} \right) \right]^4 \tag{79}$$

$$p_l^{(k,m+1)} = p + p_c^{(k,m+1)}$$

Step 28: Perform flash calculation with the algorithm described in section 4.1 with the updated vapor phase pressure.
Step 29: If $|n_l^{(k,m+1)} - n_l^{(k,m)}| < \varepsilon$, stop iteration and go to step 43.
Step 30: go to step 26.
Step 31: If $S_v = 0$ and $S_l \geq 1$, there is liquid-like fluid, and initial K-value for flash calculation
Step 32: If $S_v \geq 1$ and $S_l = 0$, there is vapor-like fluid, and initial K-value for flash calculation.
Step 33: If $S_v \geq 1$ and $S_l \geq 1$, there is phase split, and initial K-value for flash calculation.
Step 34: set iteration counter m=0.
Step 35: initialize vapor or liquid phase pressure with stability test result for flash calculation.
Step 36: Perform flash calculation with the algorithm described in section 4.1.
Step 37: If there is no solution for Eq. (53), finalize the solution with Eq. (65) or Eq. (66) and exit.
Step 38: Update iteration counter m with m+1.
Step 39: update phase pressure with $$p_c^{(k,m+1)} = \frac{2\sigma\cos\theta}{r_K^{(k)}}, \quad \sigma = \sum_{i=1}^{n_c}\left[(Par)_i\left(\frac{x_i^{(k,m)}}{\overline{V}_l^{(k,m)}} - \frac{y_i^{(k,m)}}{\overline{V}_v^{(k,m)}}\right)\right]^4 \quad (80)$$

$p_v^{(k,m+1)} = p + p_c^{(k,m+1)}$, for oil type fluid $p_l^{(k,m+1)} = \max(p - p_c^{(k,m+1)}, p_{l,min})$, for gas type fluid Step 40: Perform flash calculation with the algorithm described in section 4.1 with the updated liquid phase pressure.

Step 41: If $|n_l^{(k,m+1)} - n_l^{(k,m)}| < \varepsilon$, stop iteration and go to step 43.

Step 42: go to step 38.

Step 43: compute $$s_l^{(k)} = \frac{n_l^{(k)}\overline{V}_l^{(k)}}{n_l^{(k)}\overline{V}_l^{(k)} + n_v^{(k)}\overline{V}_v^{(k)}} \quad (81)$$

Step 44: Determine $r_K^{(k+1)}$ from curve $s_l(r)$, at which $$s_l^{(k)} = s_l(r_K^{(k+1)}) \quad (82)$$

Step 45: if $|r_K^{(k+1)} - r_K^{(k)}| < \varepsilon$, stop iteration.

Step 46: update iteration counter k with k+1, go to step 9. The flow chart in FIG. 3 demonstrates the structure of this multi-level iterative solution algorithm. Only the key steps are shown in this figure. The first computation box (31) is associated with step 9 to perform the phase stability test, which is described in section 3.2. The second computation box (32) corresponds to step 28, which is to solve Eq. (3). The first check point (34) is related to step 41, which is designed to check the convergence of the solution of the liquid mole fraction computed in the third computation box (33). The second checking point (36) corresponds to step 45, which is used to check the convergence of the solution of the critical pore radius of the phase equilibrium calculated in fourth computation box (35).

4.4 Known $p_c$ Curve Data

Three loops are designed to solve Eq. (6) to obtain the flash calculation results. The outer most loop is used to determine the capillary pressure. The mid-loop is for determine the K-values for the given liquid and vapor phase pressures. The inner most loop is for solving the vapor mole fractions $n_v$ and $n_l$. The mid- and inner most loops are integrated for the VLE calculation, described in section 4.1.

Step 1: Obtain the input parameters contact angle $\theta$, $\{z_i\}$, p, T, and $p_c$ vs. saturation table.

Step 2: Identify fluid type with phase envelope and critical point $(T_c, P_c)$.

Step 3: If $T < T_c$, it is oil type fluid and fix liquid phase pressure with Eq. (63).

Step 4: If $T > T_c$, it is gas type fluid and fix vapor phase pressure with Eq. (64).

Step 5: Perform stability test using procedure described in section 3.2 with given composition $\{z_i\}$, p.

Step 5: set iteration counter k=0.

Step 6: Initialize liquid saturation and capillary pressure with $(p_c)^{(0)}$ and initialize phase pressures with Eq. (83).

$p_v^{(0)} = p + p_c^{(0)}$, for oil type fluid $p_l^{(0)} = \max(p - p_c^{(0)}, p_{l,min})$, for gas type fluid (83)

Step 7: If there is a trivial solution $S_v = 0$ and $S_l = 0$, or $S_v = 0$ and $S_l < 0.95$, or $S_v < 0.95$ and $S_l = 0$, no phase split. Finalize the solution with Eq. (65) or Eq. (66) and exit.

Step 8: If $S_v = 0$ and $S_l \geq 1$, or $S_v \geq 1$ and $S_l = 0$, or If $S_v \geq 1$ and $S_l \geq 1$, Perform flash calculation with the algorithm described in section 4.1 and determine $r_K^{(k+1)}$ with Eq. (82).

Step 9: Use the interpolation method to determine capillary pressure $(p_c)^{(k+1)}$ with $(s_l)^{(k+1)}$ and capillary pressure vs saturation table $(p_c)^{(k+1)} = p_c[(s_l)^{(k+1)}]$ $p_v^{(k+1)} = p + p_c^{(k+1)}$, for oil type fluid $p_l^{(k+1)} = \max(p - p_c^{(k+1)}, p_{l,min})$, for gas type fluid (84)

Step 10: If $|n_l^{(k+1)} - n_l^{(k)}| < \varepsilon$, stop iteration.

Step 11: update iteration counter k with k+1.

Step 12: go to step 12.

5. Testing Results

These new flash calculation algorithms have been tested with different types of fluids, pore size, and pore size distributions. Two examples are presented.

EXAMPLE 1

Light Oil

Figure 4:
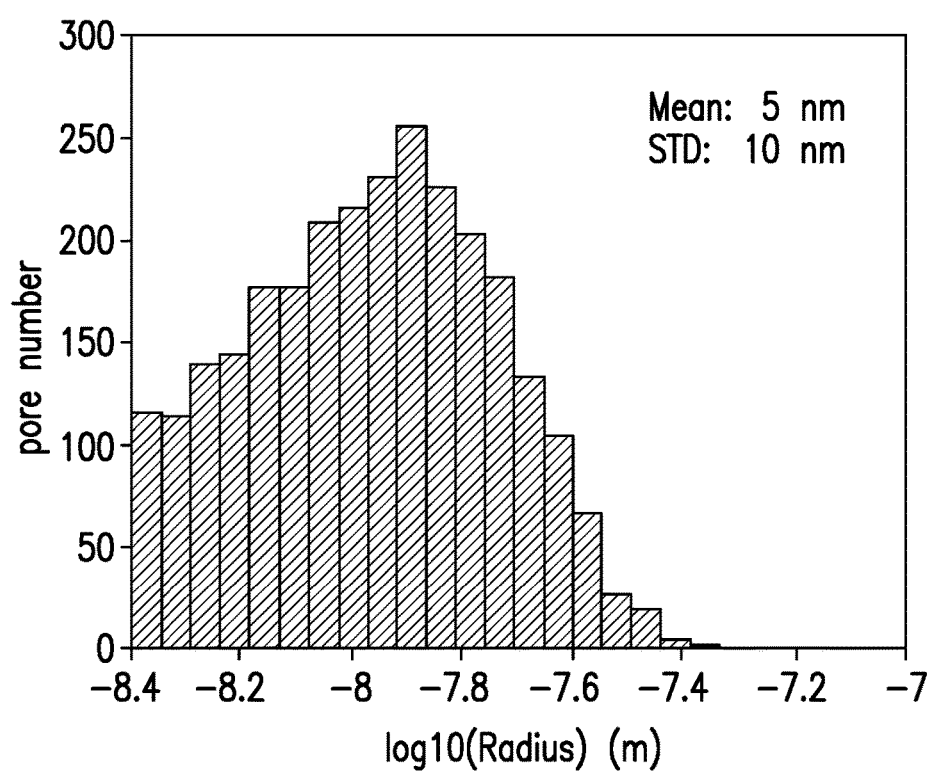
FIG. 4 depicts aspects of a pore size distribution.
Figure 5A:
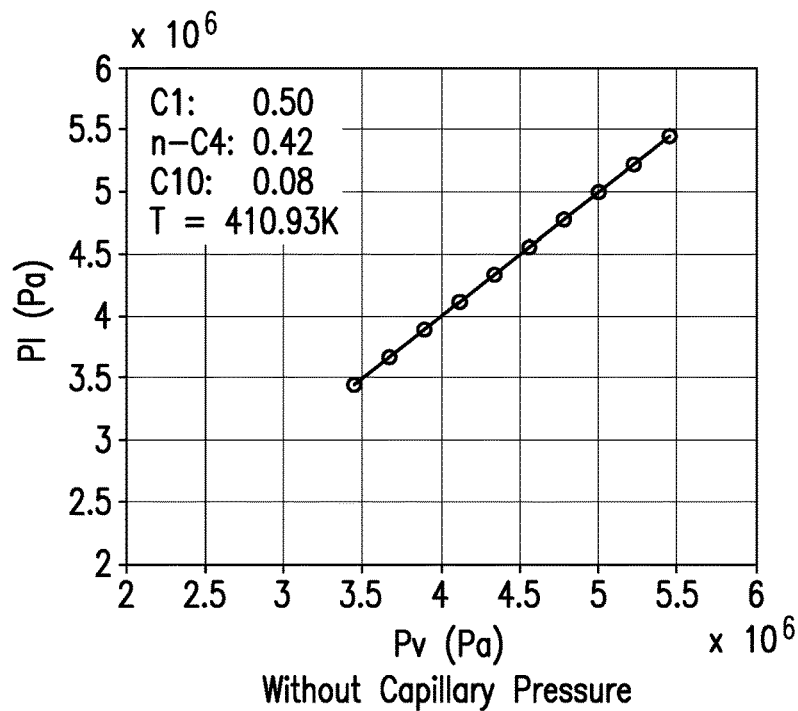
FIGS. 5A and 5B, collectively referred to as FIG. 5, depict comparative aspects of liquid phase pressure and vapor phase pressure with and without capillary pressure.
Figure 5B:
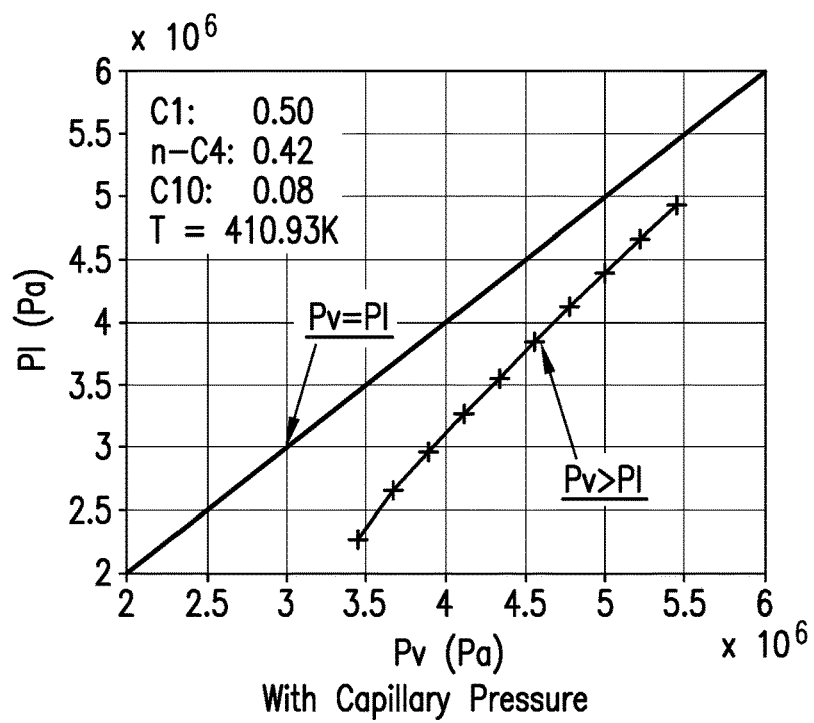
Figure 6A:
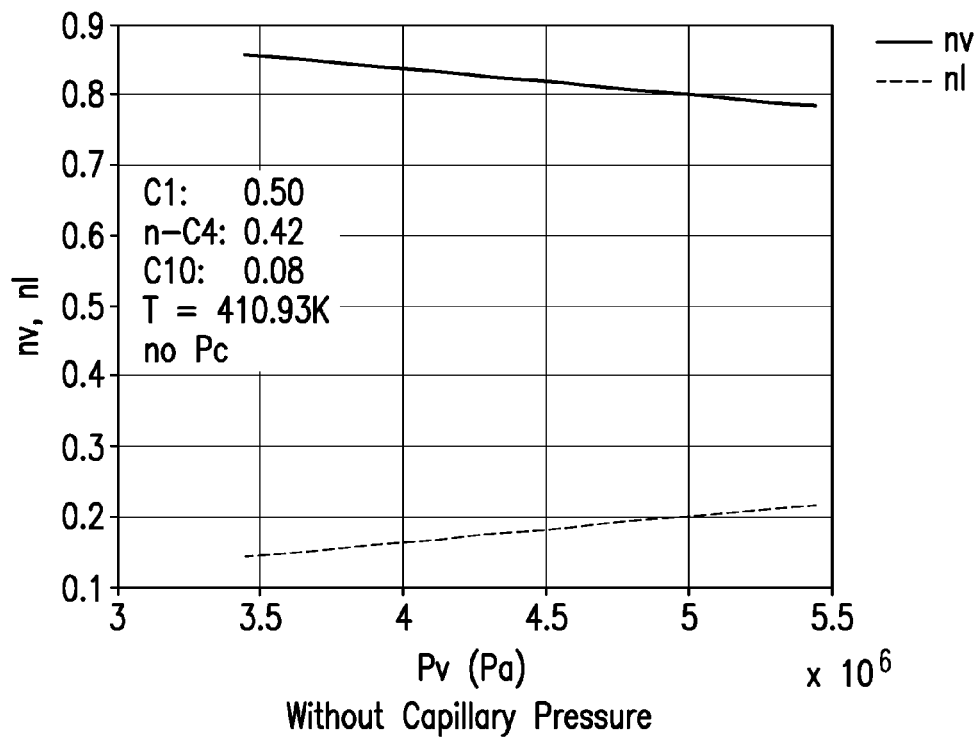
FIGS. 6A and 6B, collectively referred to as FIG. 6, depict comparative aspects of liquid mole fraction and vapor mole fraction with and without capillary pressure.
Figure 6B:
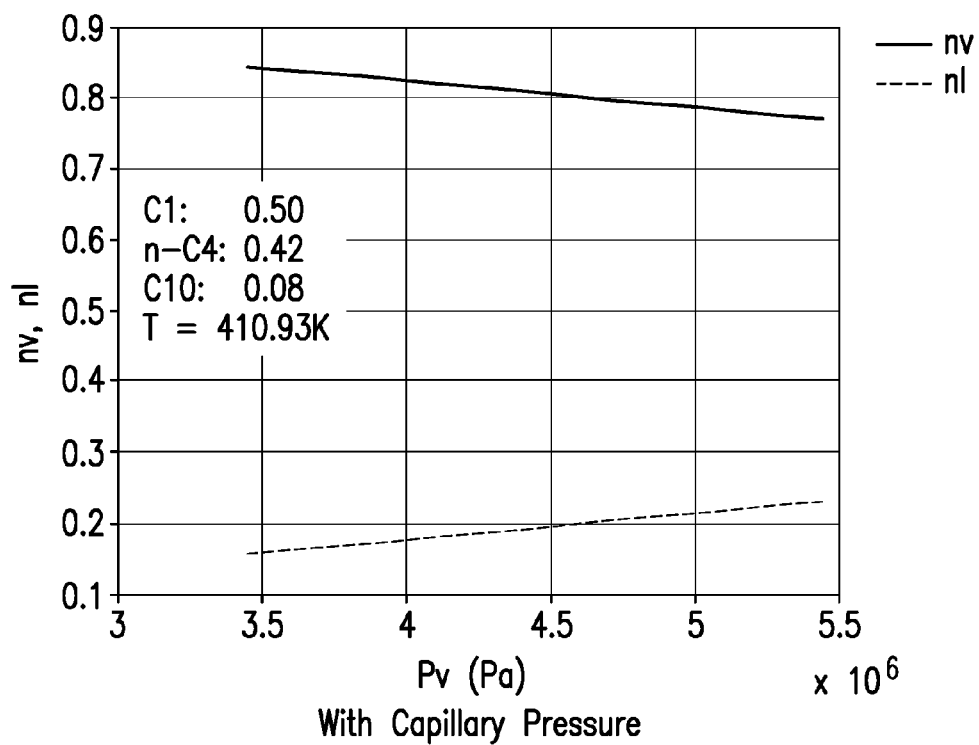
Figure 7A:
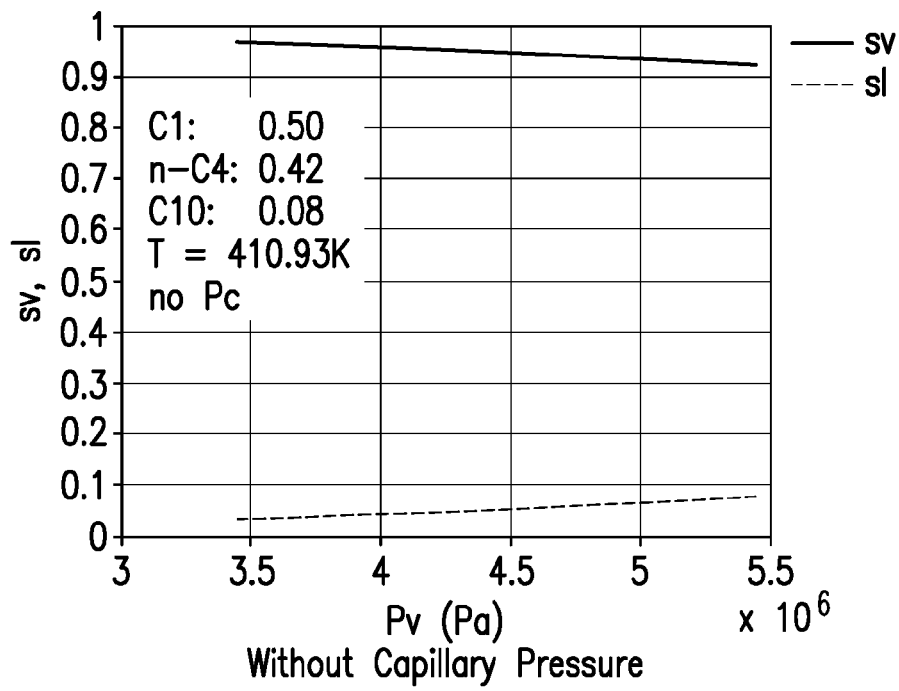
FIGS. 7A and 7B, collectively referred to as FIG. 7, depict comparative aspects of liquid saturation and vapor saturation with and without capillary pressure.
Figure 7B:
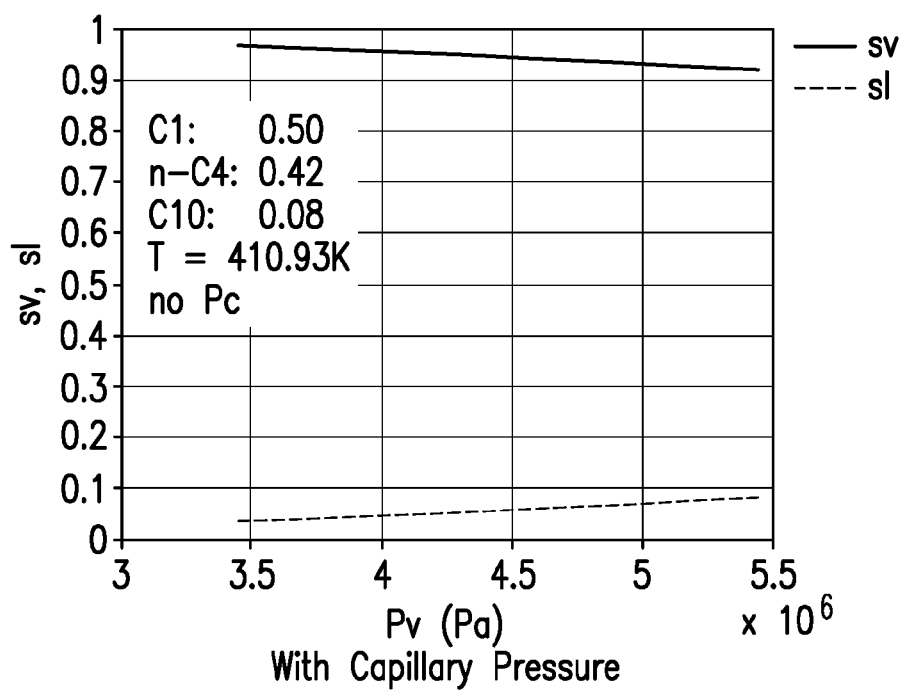
Figure 8A:
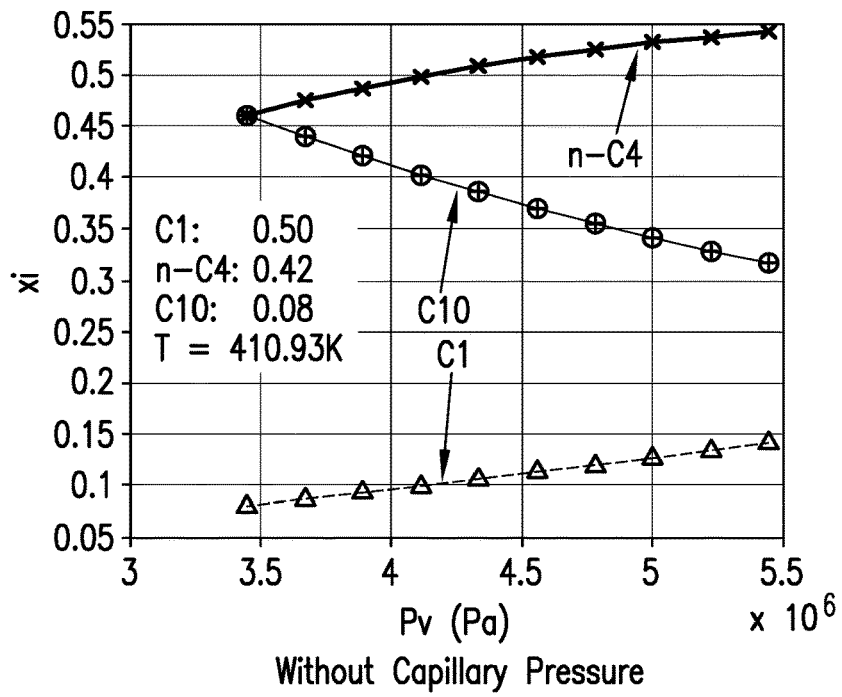
FIGS. 8A and 8B, collectively referred to as FIG. 8, depict comparative aspects of liquid molar fractions with and without capillary pressure.
Figure 8B:
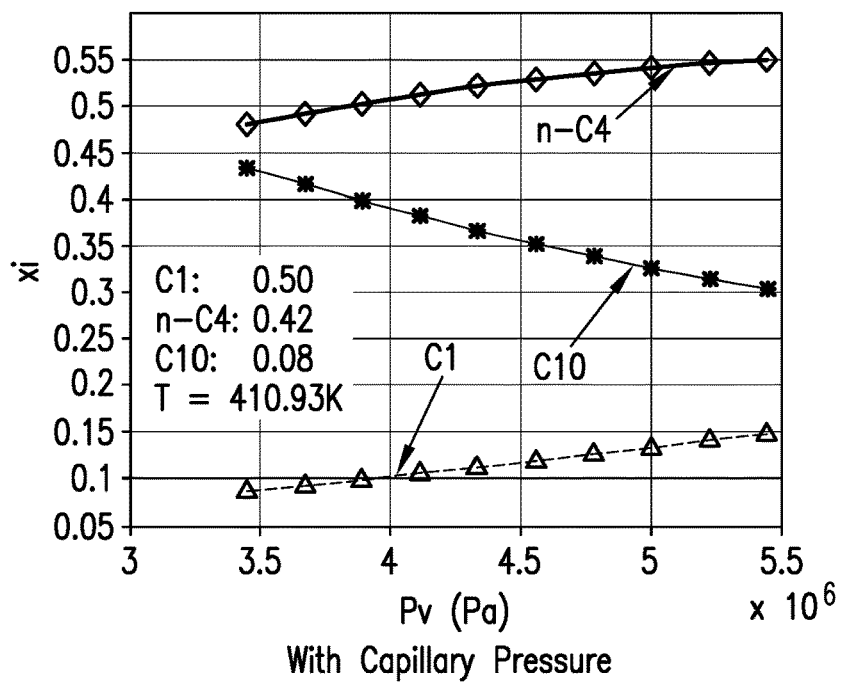
Figure 9A:
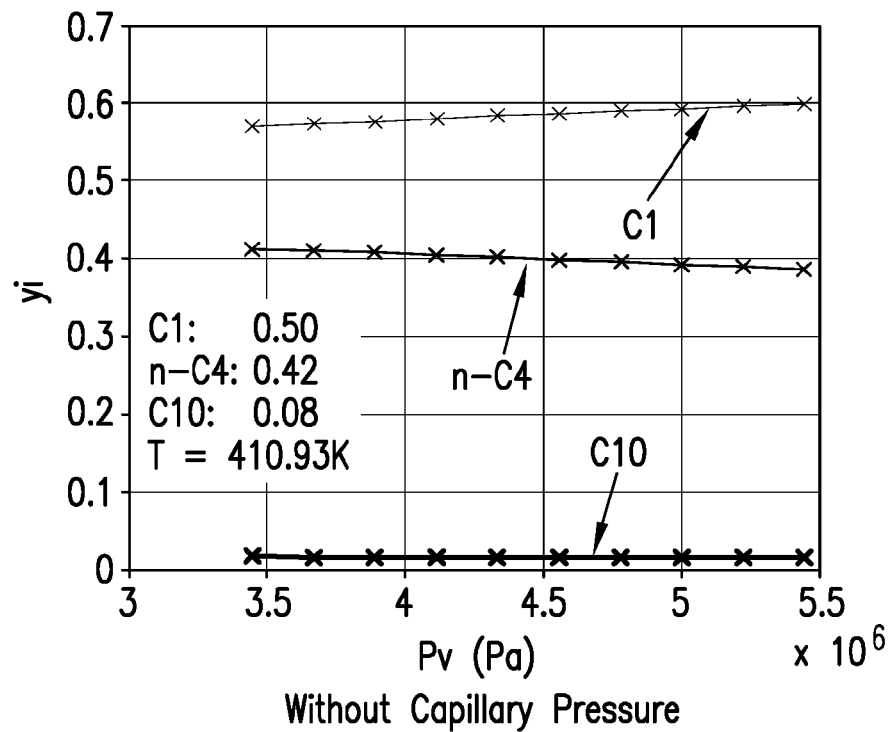
FIGS. 9A and 9B, collectively referred to as FIG. 9, depict comparative aspects of liquid molar fractions with and without capillary pressure.
Figure 9B:
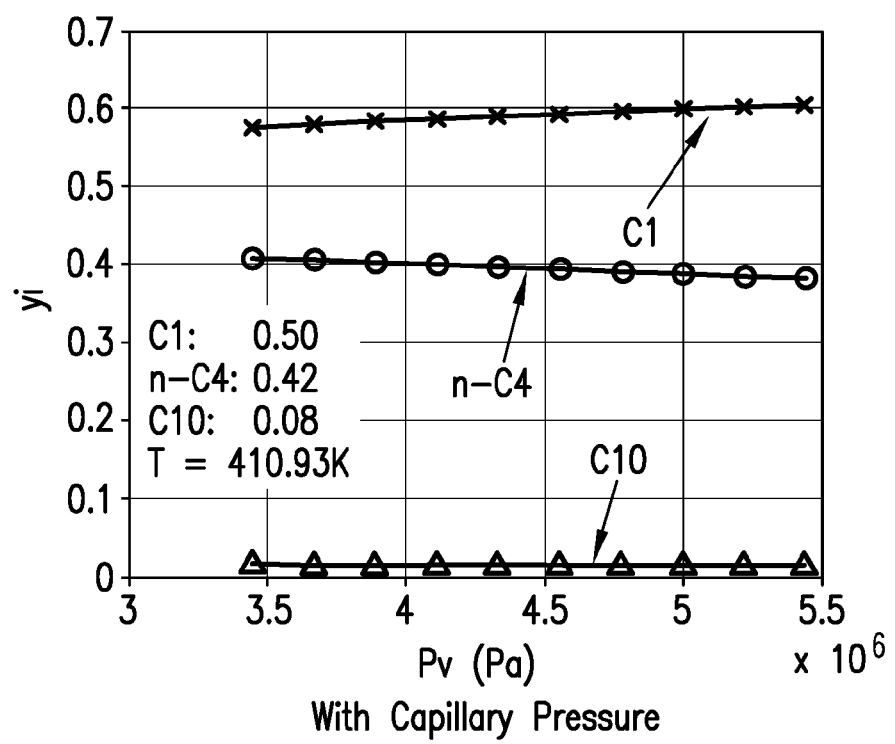

The fluid type for the first example is light oil. Its composition is 50% methane, 42% norm-butane, and 8% decane. The pore size distribution has mean pore radius of 5 nm and standard deviation of 10 nm. The temperature is 410.93° K. The pressure range is (3.45, 5.48) MPa. The flash computation results for the confined fluid are compared with the flash calculation results for the bulk fluid, as illustrated in FIGS. 4-9. FIG. 4 depicts aspects of a pore size distribution for this example. FIG. 5 depicts comparative aspects of liquid phase pressure and vapor phase pressure with and without capillary pressure consideration for this example. FIG. 6 depicts comparative aspects of liquid mole fraction and vapor mole fraction with and without capillary pressure consideration for this example. FIG. 7 depicts comparative aspects of liquid saturation and vapor saturation with and without capillary pressure consideration for this example. FIG. 8 depicts comparative aspects of liquid molar fractions with and without capillary pressure consideration for this example. FIG. 9 depicts comparative aspects of liquid molar fractions with and without capillary pressure consideration for this example. The comparison results show that the pore confinement causes minor differences in flash calculation results. The reason is that the density difference of the vapor phase and liquid phase is small at temperature of 410.93° K.

EXAMPLE 2

Eagle Ford Shale Condensate with Temperature T=410° K

Figure 10A:
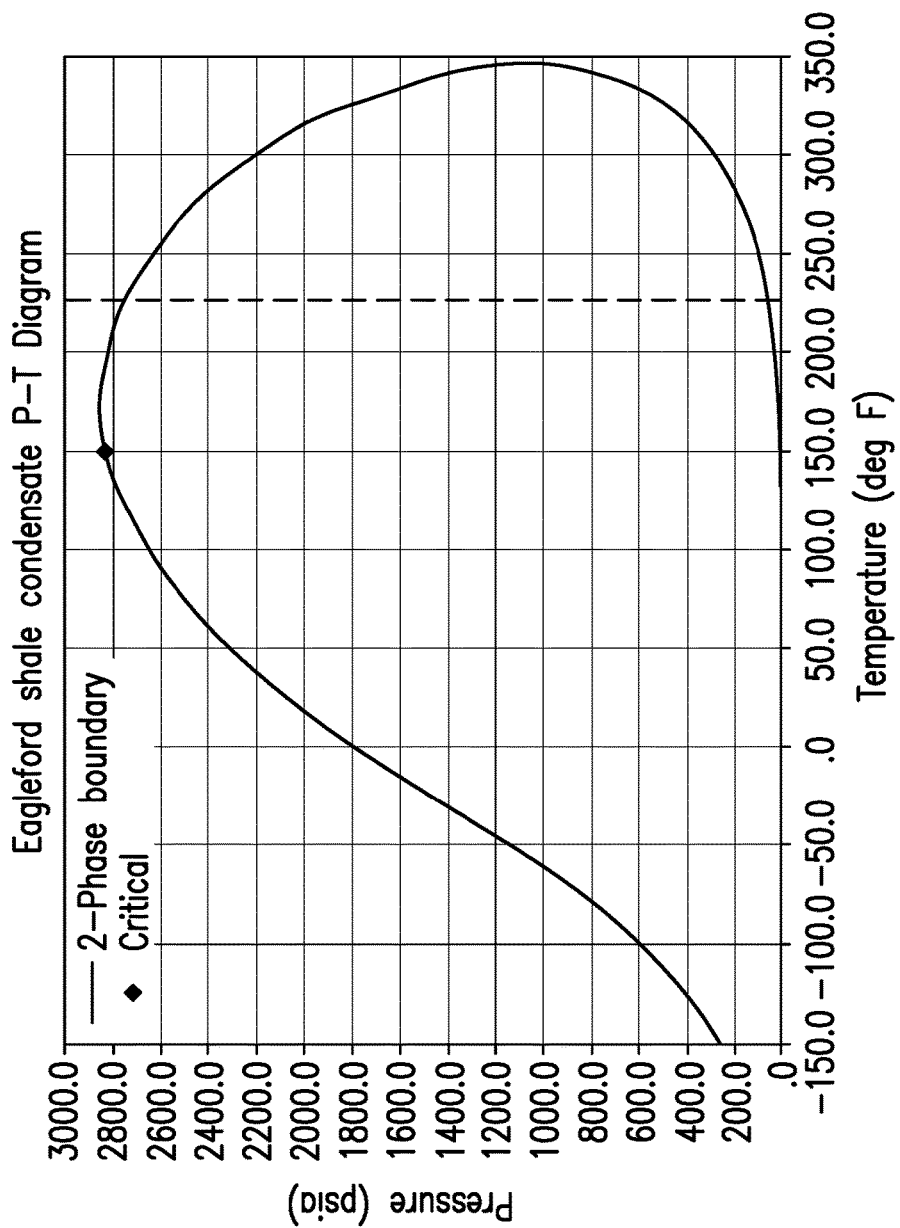
FIGS. 10 A and 10B, collectively referred to as FIG. 10, depict aspects of a phase envelope for Eagle Ford condensate with C10 in field units and SI units.
Figure 10B:
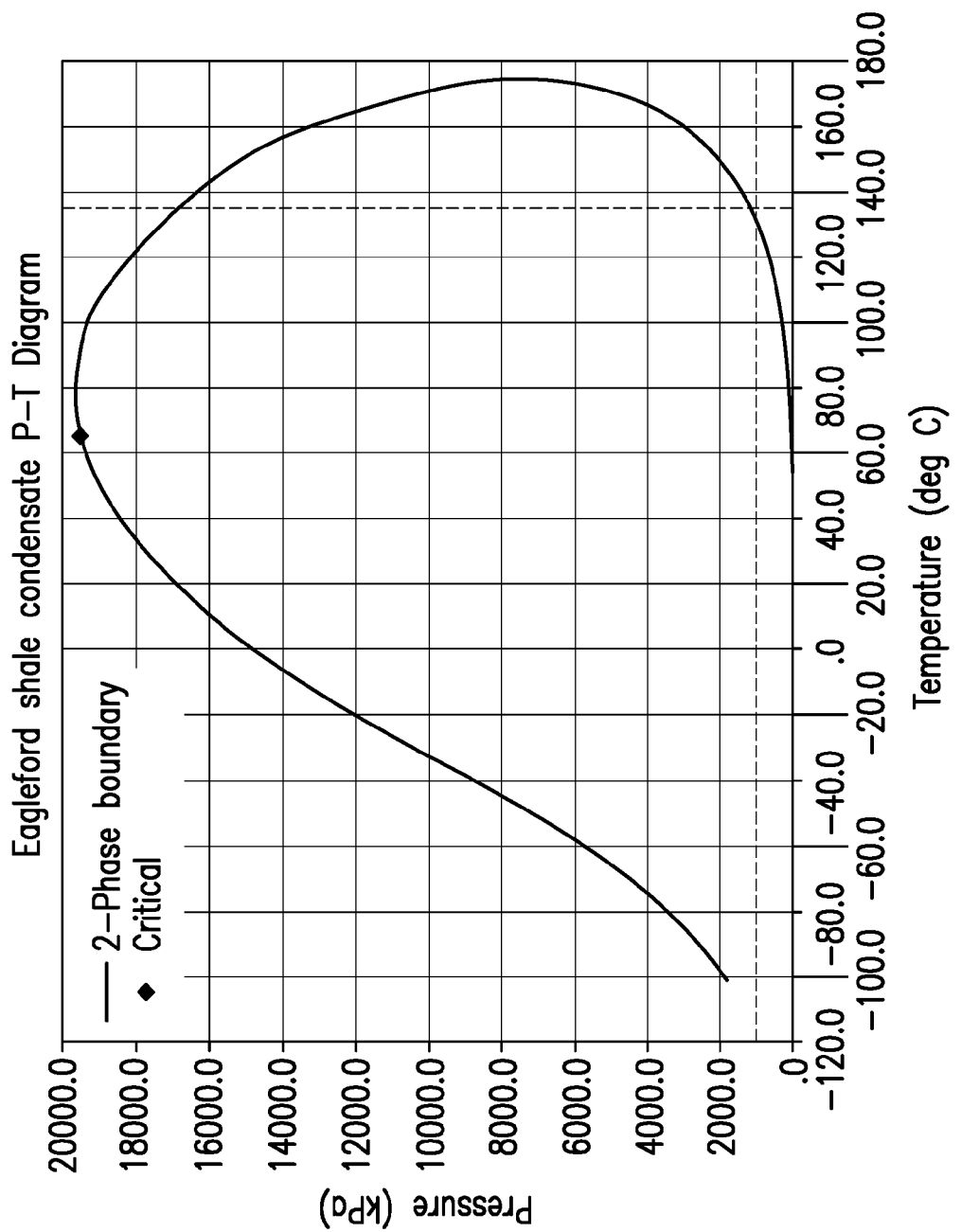
Figure 11A:
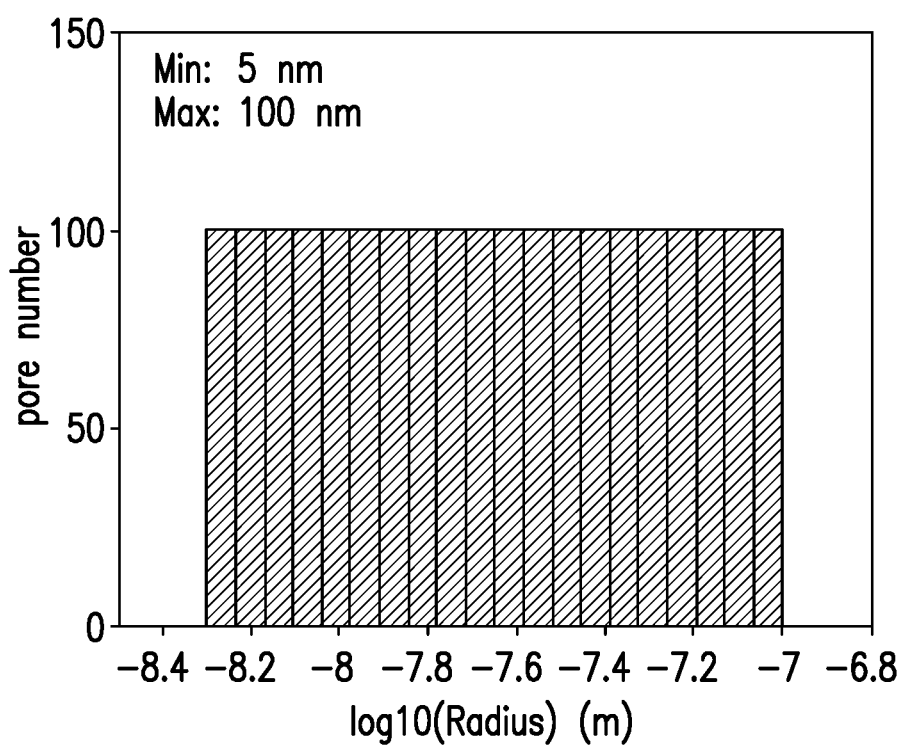
FIGS. 11A and 11B. collectively referred to as FIG. 11, depict aspects of pore size distribution and liquid saturation versus pore size.
Figure 11B:
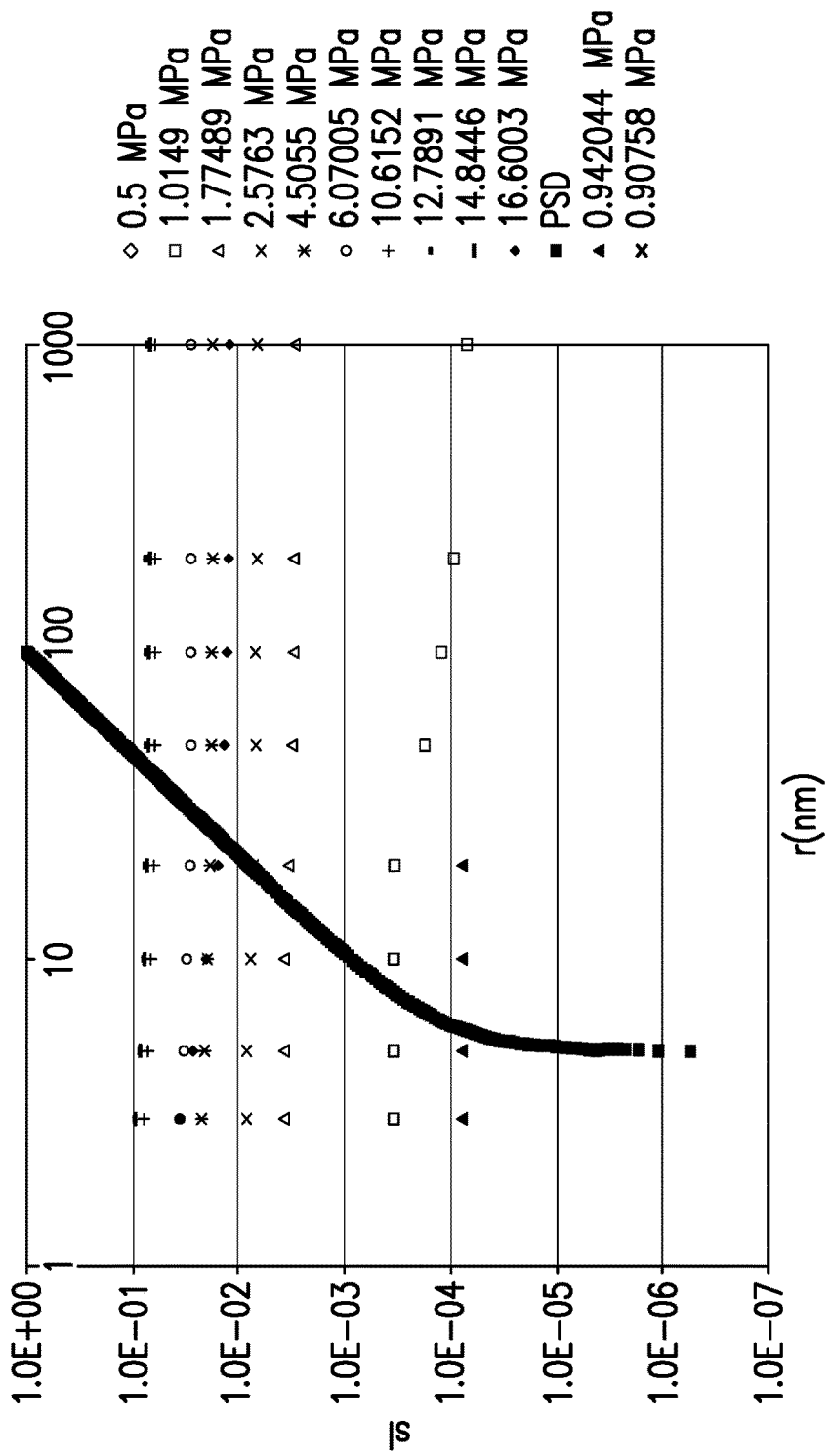
Figure 12A:
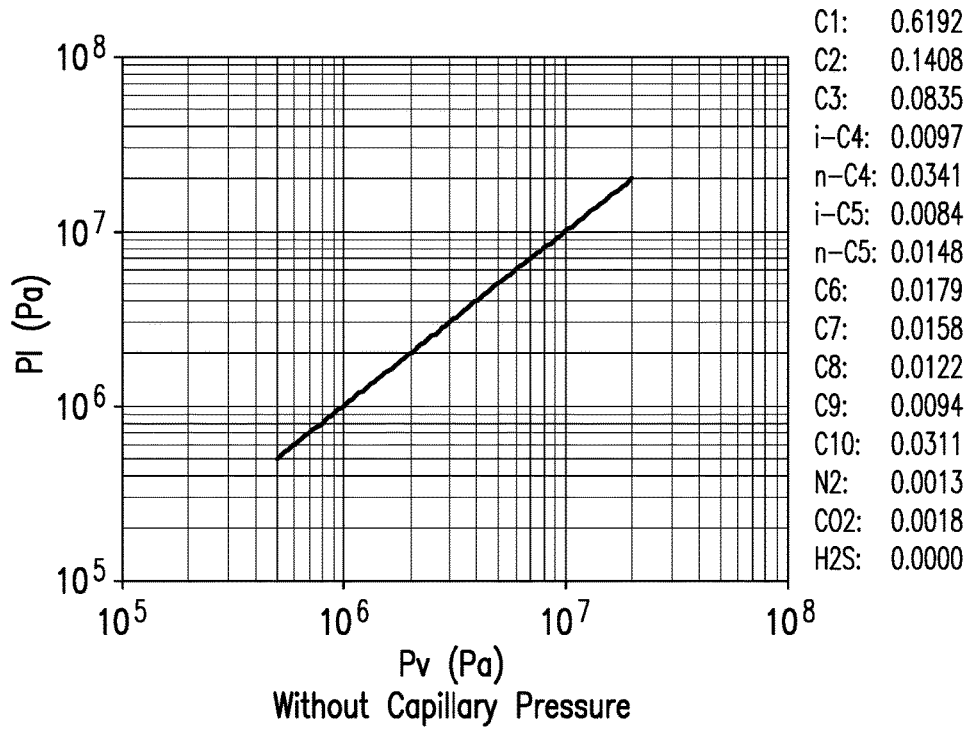
FIGS. 12A and 12B, collectively referred to as FIG. 12, depict aspects of phase pressure and capillary pressure.
Figure 12B:
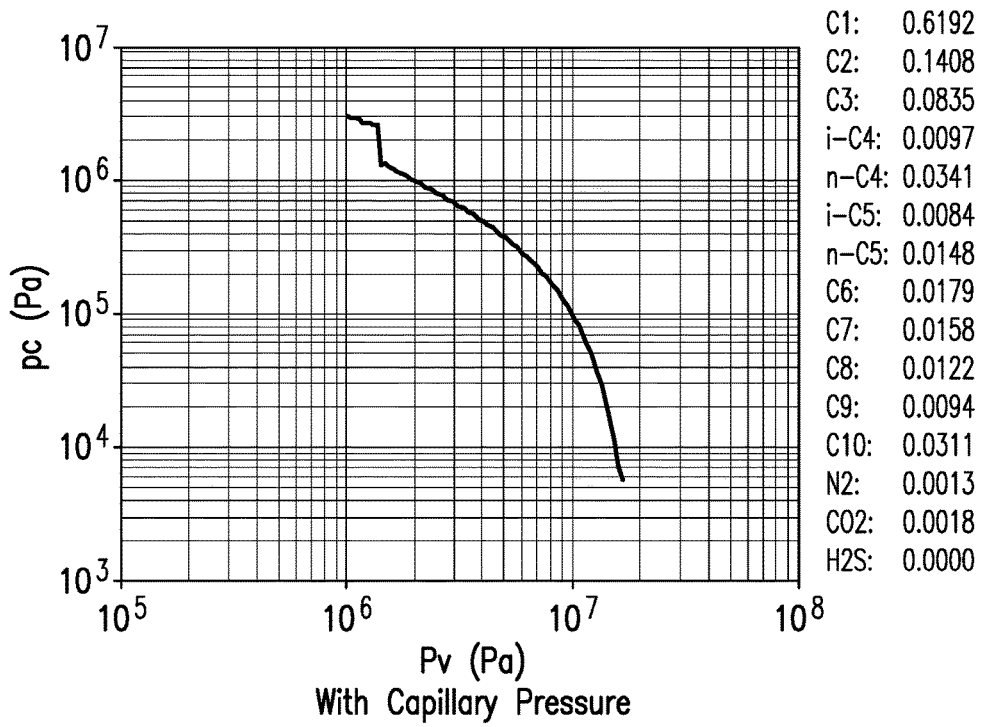
Figure 13A:
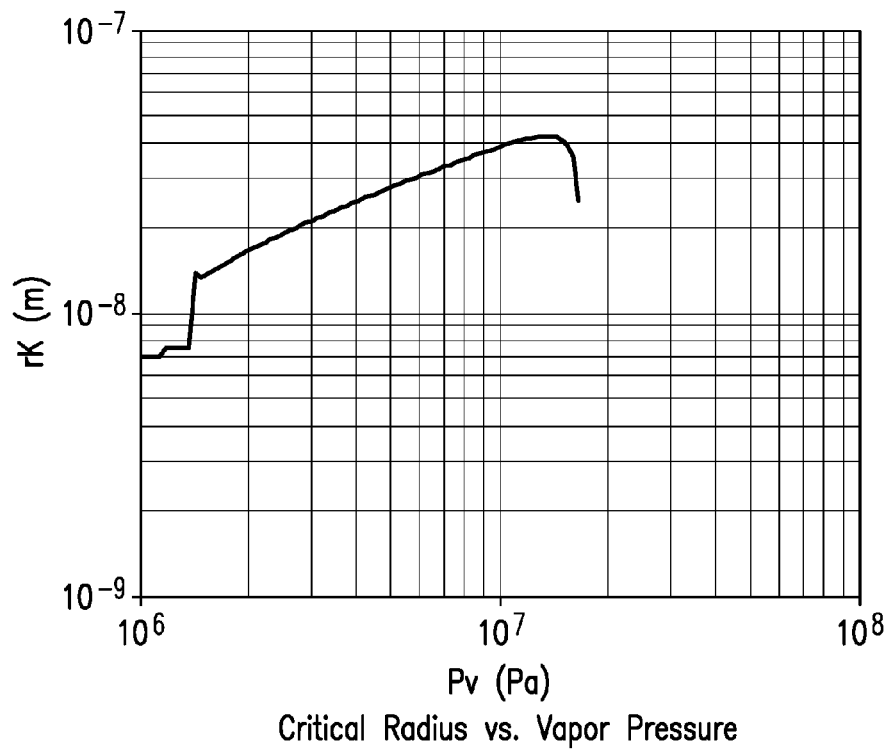
FIGS. 13A and 13B, collectively referred to as FIG. 13, depict aspects of critical radius versus vapor pressure and $K_i$ values versus vapor pressure.
Figure 13B:
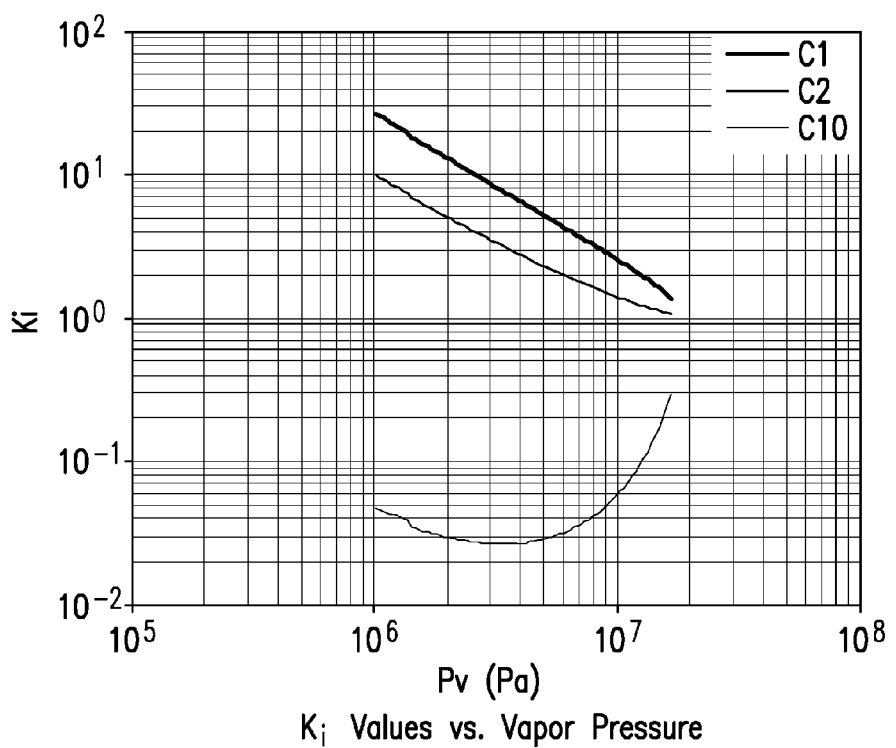
Figure 14A:
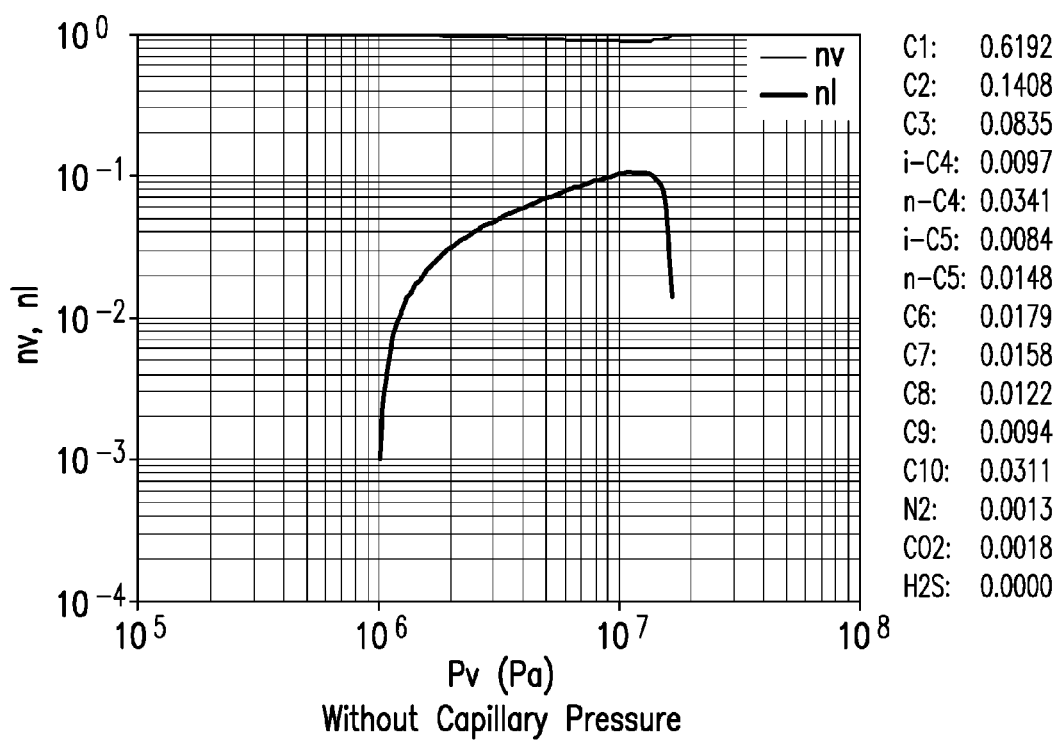
FIGS. 14A and 14B, collectively referred to as FIG. 14, depict comparative aspects of liquid and vapor mole fractions with and without capillary pressure.
Figure 14B:
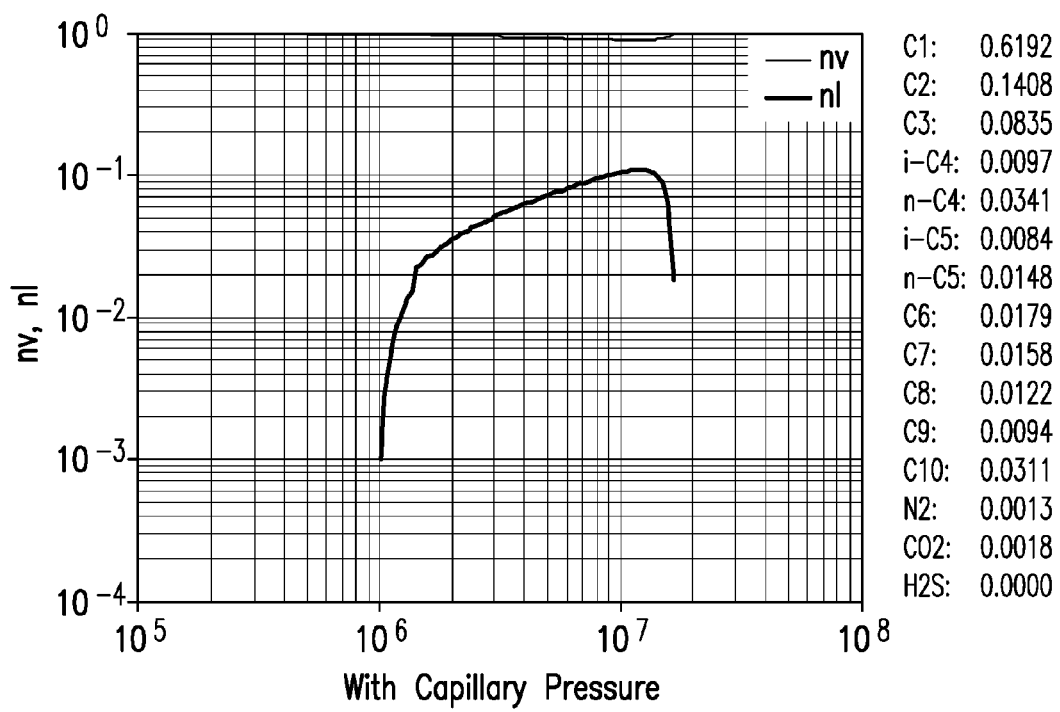
Figure 15A:
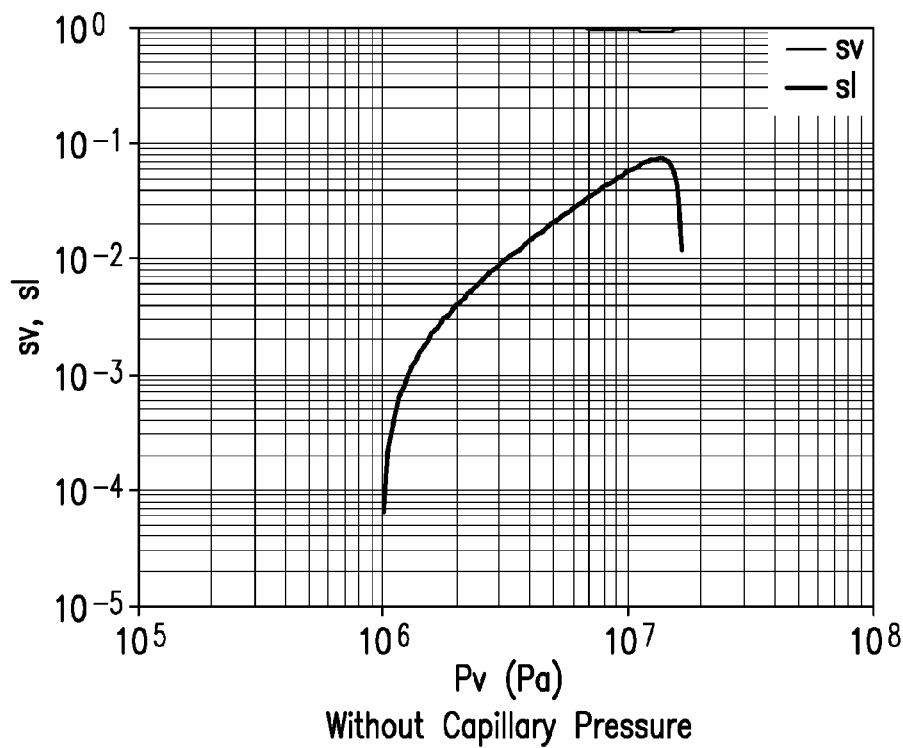
FIGS. 15A and 15B, collectively referred to as FIG. 15, depict comparative aspects of liquid and vapor saturations.
Figure 15B:
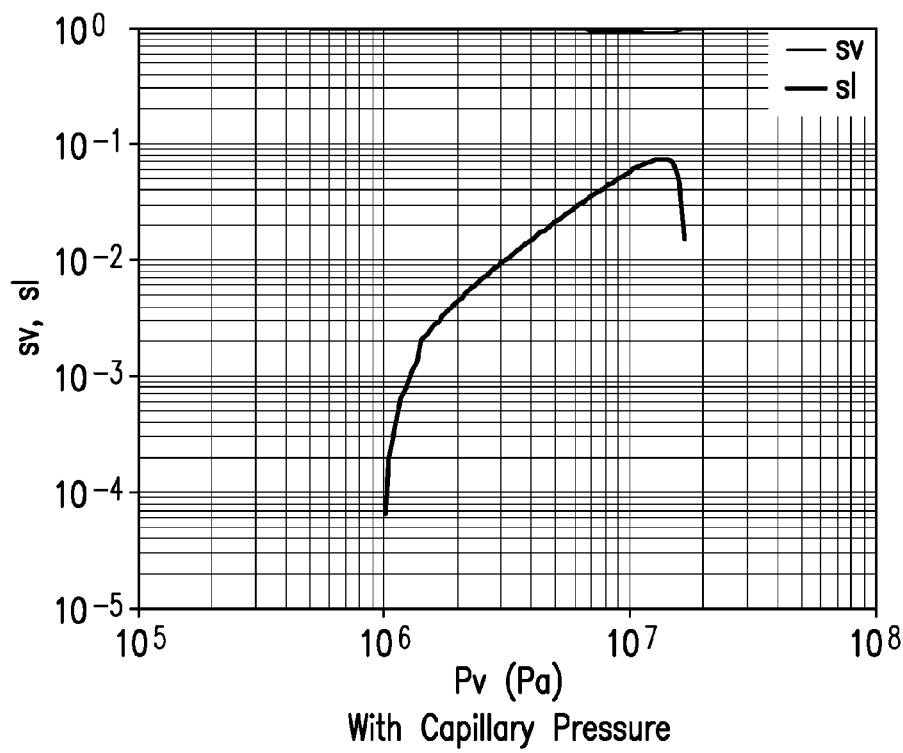
Figure 16A:
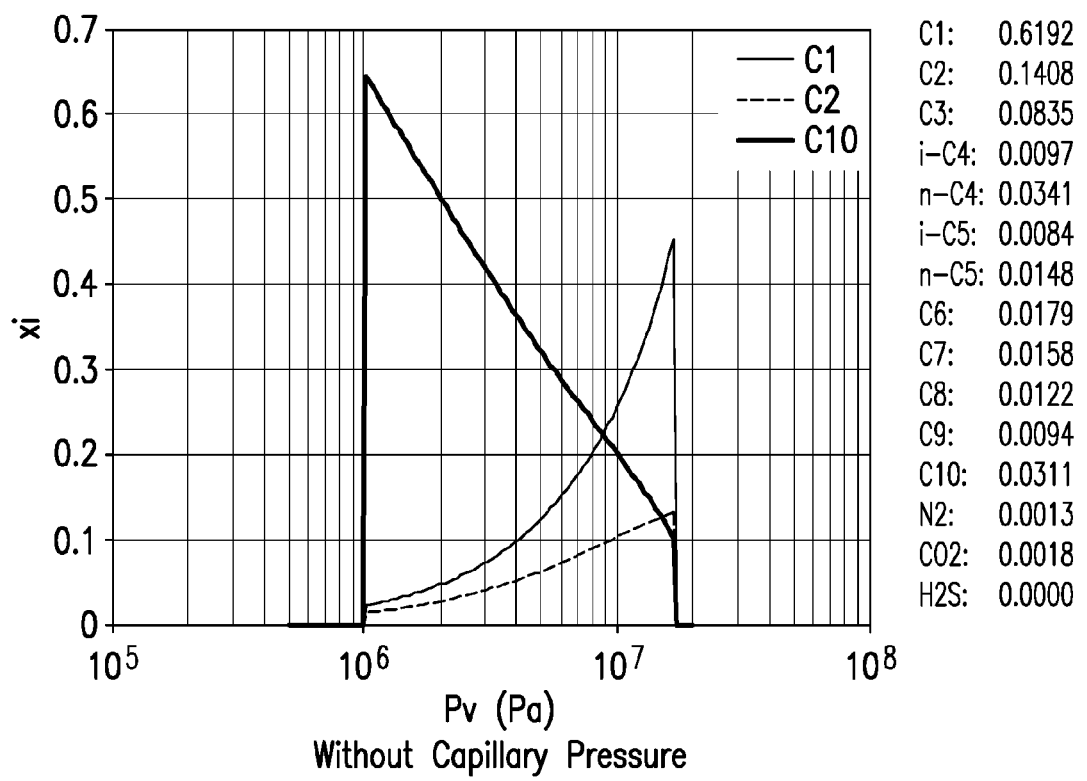
FIGS. 16A and 16B, collectively referred to as FIG. 16, depict aspects of liquid molar fractions.
Figure 16B:
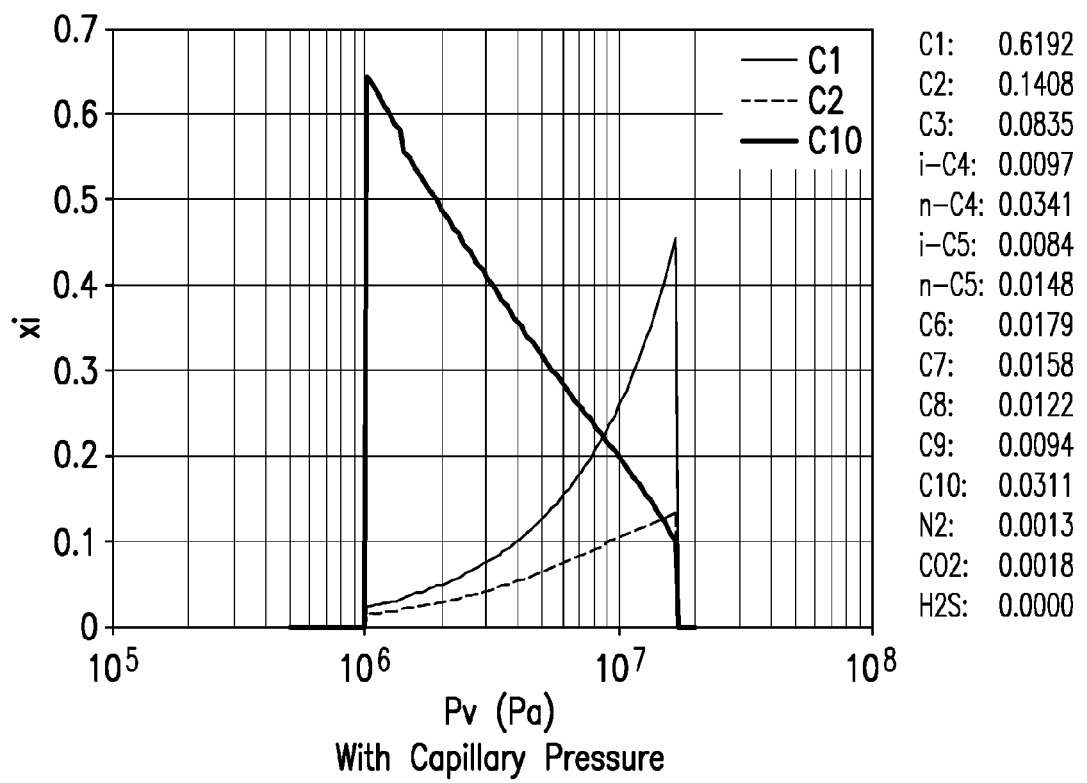
Figure 17A:
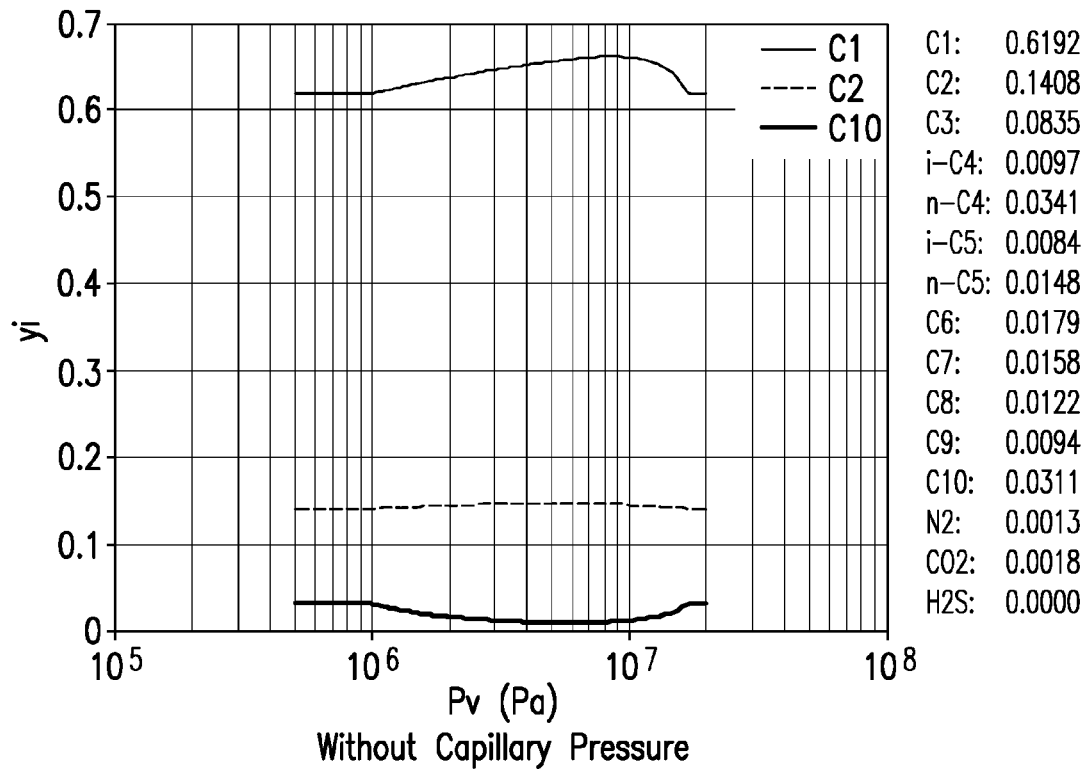
FIGS. 17A and 17B, collectively referred to as FIG. 17, depict comparative aspects of vapor molar fractions with and without capillary pressure.
Figure 17B:
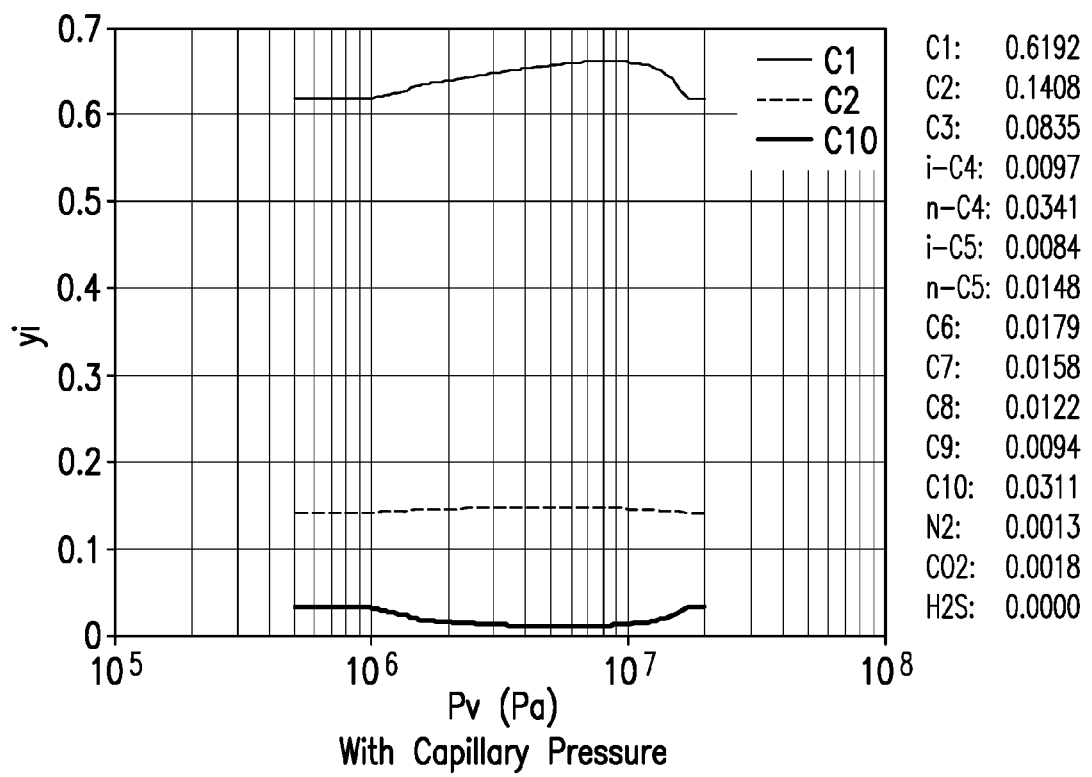

The fluid type for the second example is the condensate in the Eagle Ford Shale. Its composition is C1: 0.6192, C2: 0.1408, C3: 0.0835, i-C4: 0.0097, n-C4: 0.0341, i-C5: 0.0084, n-C5: 0.0148, C6: 0.0179, C7: 0.0158, C8: 0.0122, C9: 0.0094, C10: 0.0311, N2: 0.0013, CO2: 0.0018. The pore size distribution has a uniform distribution in this example as illustrated in FIG. 11A. The minimum pore size is 5 nm and the maximum pore size is 100 nm. The temperature is 410° K. The pressure range is (0.5, 20) MPa. FIG. 11B illustrates liquid saturation versus pore size. FIG. 10 shows the phase envelope of the bulk fluid (Eagleford fluid condensate with C10), the pressure path is indicated with the vertical line in FIG. 10(*a*) depicting field units while FIG. 10(*b*) depicts SI units. The flash computation results for the confined fluid are compared with the flash calculation results for the bulk fluid, as illustrated in FIGS. 12-17. FIG. 12 depicts aspects of phase pressure and capillary pressure for this example. FIG. 13 depicts aspects of critical radius versus vapor pressure and $K_i$ values versus vapor pressure for this example. FIG. 14 depicts comparative aspects of liquid and mole fractions with and without capillary pressure consideration for this example. FIG. 15 depicts comparative aspects of liquid and vapor saturations for this example. FIG. 16 depicts aspects of liquid molar fractions for this example. FIG. 17 depicts comparative aspects of vapor molar fractions with and without capillary pressure consideration for this example. The comparison results show that the dominant phase of the fluid in Eagle Ford shale is the vapor phase. The capillary pressure caused by the pore confinement is less than 1 MPa during the pressure depletion. Capillary condensation causes the increment in the liquid saturation, but the change is minor at temperature 410° K.

In summary, the EOS model and corresponding computational techniques can be used to estimate various values of properties of liquid and vapor hydrocarbons components in an unconventional reservoir such as a shale reservoir.

In a first embodiment (1), liquid and vapor molar fractions of components, liquid mole fraction, vapor mole fraction, liquid saturation, and vapor saturation of a mixture of hydrocarbons in nano-pores are estimated with the contact angle, fluid composition, vapor phase pressure, and liquid phase pressure given as inputs.

In a second embodiment (2), liquid and vapor molar fractions of components, liquid mole fraction, vapor mole fraction, liquid saturation, vapor saturation and liquid phase pressure of a mixture of hydrocarbons in nano-pores are estimated with the given contact angle, fluid composition, vapor phase pressure, and constant pore size given as inputs. While a phase equilibrium model with constant pore size pressure is known, its solution method is embedded in the novel solution method of the phase equilibrium model disclosed herein with logical relationships illustrated in FIG. 3.

In a third embodiment (3), liquid and vapor molar fractions of components, liquid mole fraction, vapor mole fraction, liquid saturation, vapor saturation and liquid phase pressure of a mixture of hydrocarbons in nano-pores are estimated with the contact angle, fluid composition, vapor phase pressure, and pore size distribution given as inputs.

In a fourth embodiment (4), liquid and vapor molar fractions of components, liquid mole fraction, vapor mole fraction, liquid saturation, vapor saturation, and liquid phase pressure of a mixture of hydrocarbons in nano-pores are estimated with the contact angle, fluid composition, vapor phase pressure, and measured capillary pressure data given as inputs. In this embodiment, the measured capillary pressure data is related to the pore size distribution.

In general, production processes of shale gas/oil reservoirs are pressure depletion processes, i.e., the reservoir pressure continually decreases due to the production of hydrocarbons. Hence, reservoir engineers may want to know the phase behaviors of confined hydrocarbons during a hydrocarbon production process. Accordingly, in one or more embodiments, the above discussed embodiments may be performed for a given sequence of reservoir pressures.

It can be appreciated that after one or more properties of a hydrocarbon in nano-pores of an earth formation are estimated by the methods disclosed herein, an action may be performed on the formation using associated apparatus based on the one or more estimated properties. The one or more properties may be entered into a reservoir simulator and the simulator can simulate a response of the formation. For example, estimated values of liquid molar fractions, vapor molar fractions, liquid mole fraction, vapor mole fraction, liquid saturation, vapor saturation and liquid phase pressure of components of a hydrocarbon in nano-pores may be entered into the reservoir simulator and the reservoir simulator will calculate the gas and oil flow rates of the reservoir based on these estimated values. Once the calculated flow rates are known, the action may be performed based on the calculated flow rates. In one or more embodiments, the action is to control a flow rate of hydrocarbons being produced from a wellbore. In one or more embodiments, the flow rate can be controlled by controlling a flow valve or pump. In another example, oil and/or gas flow rates can be estimated at various locations throughout the reservoir by the reservoir simulator and a stage in a wellbore for hydraulic fracturing the formation can be determined to increase the hydrocarbon flow rate into the wellbore at that stage. In that reservoir simulators are commercially available and known in the art, they are not discussed in further detail.

Figure 18:
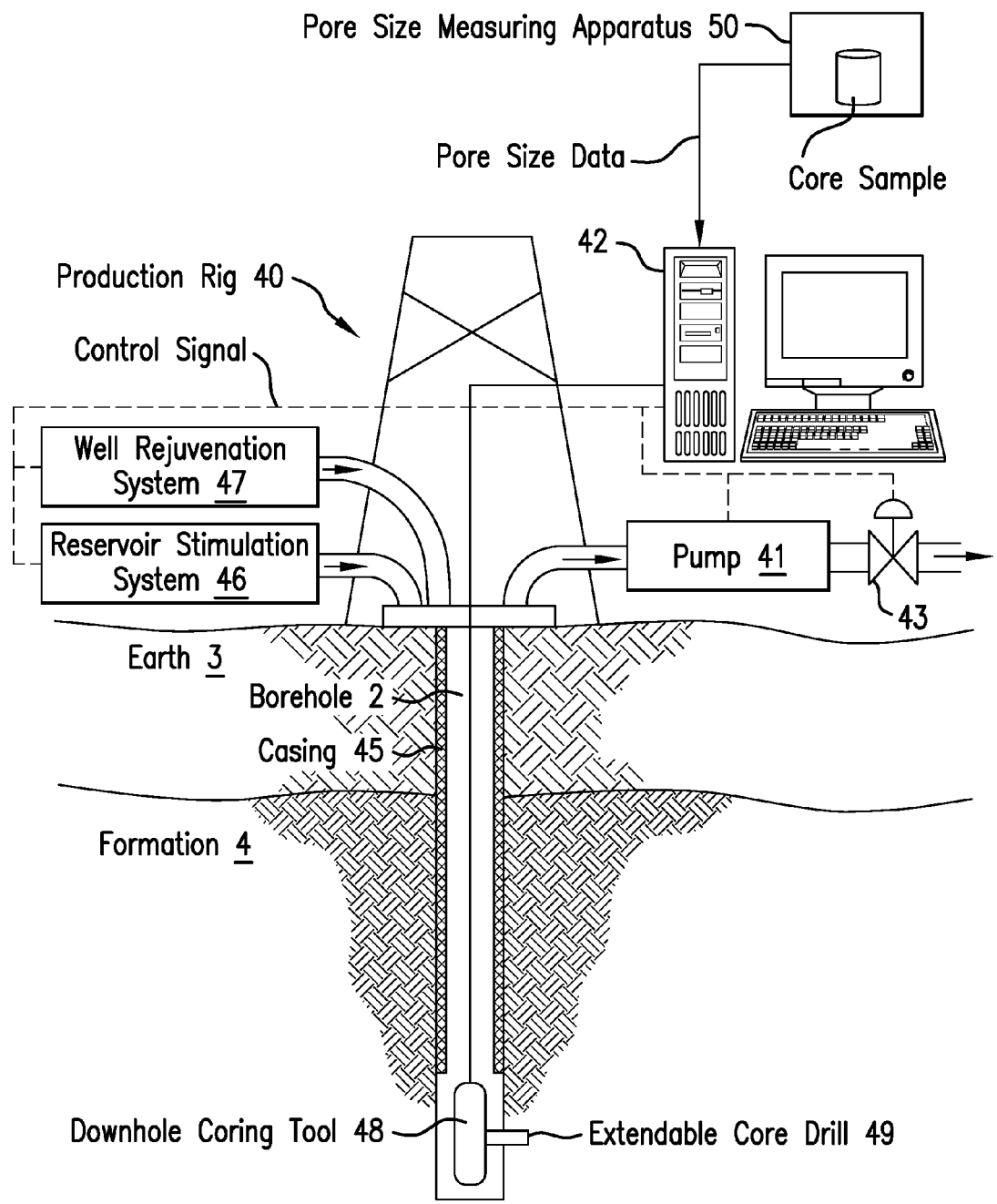
FIG. 18 depicts aspect of production equipment for producing hydrocarbons from a wellbore.

Next, examples of production equipment are discussed. FIG. 18 depicts aspects of production equipment for producing hydrocarbons from an earth formation. A production rig 40 is configured to perform actions related to the production of hydrocarbons from the borehole 2 (may also be referred to as a well or wellbore) penetrating the earth 3 having the earth formation 4. The formation 4 may contain a reservoir of hydrocarbons that are produced by the production rig 40. The production rig 40 may include a pump 41 configured to pump hydrocarbons entering the borehole 2 to the surface. A flow control valve 43 may be included for controlling the flow rate of hydrocarbons being pumped. The borehole 2 may be lined by a casing 45 to prevent the borehole 2 from collapsing. The production rig 40 may include a reservoir stimulation system 46 configured to stimulate the earth formation 4 to increase the flow of hydrocarbons. In one or more embodiments, the reservoir stimulation system 46 is configured to hydraulically fracture rock in the formation 4. The production rig 40 may also include a well rejuvenation system 47 configured to rejuvenate the borehole 2 (e.g., increase hydrocarbon flow into the borehole 2). In one or more embodiments, the well rejuvenation system 47 includes an acid treatment system configured to inject acid into the borehole 2.

The production rig 40 may also be configured to extract of core sample of the formation 4 a downhole coring tool 48. The downhole tool 48 may be conveyed through the borehole 2 by an armored wireline that also provides communications to the surface. The core sample may be extracted using an extendable core drill 49. Once the core sample is extracted, it is stored and conveyed to the surface for analysis such as by a pore size measuring apparatus 50, which in one or more embodiments may be a scanning electron microscope or a device using nitrogen absorption techniques. In general, a plurality of core samples is extracted in order to adequately represent the properties of rock present in the formation. For example, a higher number of samples would be required if the properties change significantly with depth as opposed to not changing significantly with depth.

FIG. 18 also illustrates a computer processing system 42. The computer processing system 42 is configured to implement the methods disclosed herein. Further, the computer processing system 42 may be configured to act as a controller for controlling operations of the production rig 40 to include core sample extraction and analysis. Non-limiting examples of control actions include turning equipment on or off, setting setpoints, controlling pumping and/or flow rates, and executing processes for formation stimulation and well rejuvenation. In general one or more of the control actions may be determined using a formation parameter obtained from the estimated values of properties of fluids confined in nano-pores. In one or more embodiments, the computer processing system 42 may update or receive an update of the estimated values in real time and, thus, provide control actions in real time.

Figure 19:
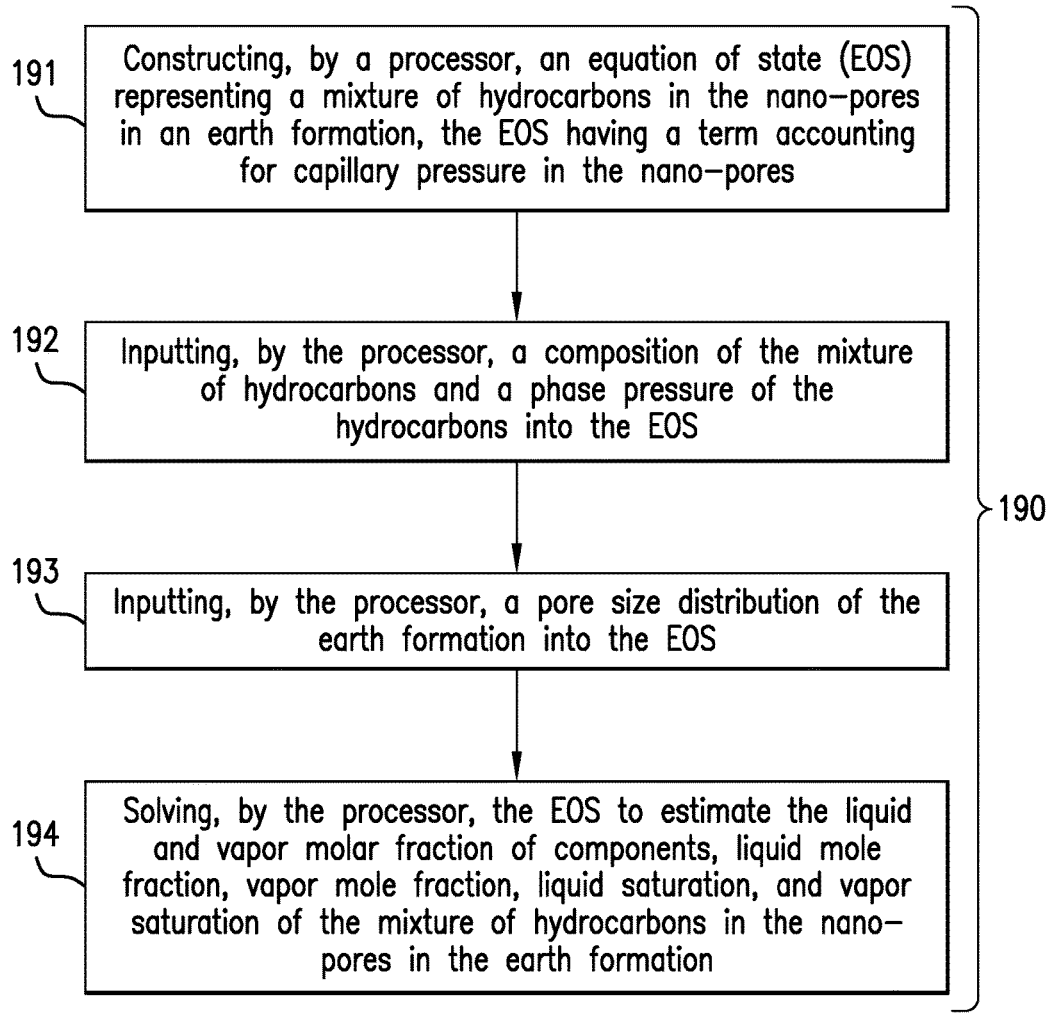
FIG. 19 is a flow chart for a method for estimating liquid molar fraction, vapor molar fraction, liquid mole fraction, vapor mole fraction, liquid saturation, and vapor saturation of components of a hydrocarbon in nano-pores in an earth formation.

FIG. 19 is a flow chart for a method 190 for a method for estimating liquid and vapor molar fraction of components, liquid mole fraction, vapor mole fraction, liquid saturation, and vapor saturation of a mixture of hydrocarbons in nano-pores in an earth formation. In one or more embodiments, at least one of those above parameters is estimated. Block 191 calls for constructing, by a processor, an equation of state (EOS) representing the mixture hydrocarbons in the nano-pores in the earth formation, the EOS having a term accounting for capillary pressure in the nano-pores. Block 192 calls for inputting, by the processor, a composition of the mixture of hydrocarbons and a phase pressure of the hydrocarbons into the EOS. Block 193 calls for inputting, by the processor, a pore size distribution of the earth formation into the EOS. Block 194 calls for solving, by the processor, the EOS to estimate the liquid and vapor molar fraction of components, liquid mole fraction, vapor mole fraction, liquid saturation, and vapor saturation of the mixture of hydrocarbons in the nano-pores in the earth formation. This block may include one or more of the above disclosed techniques for solving the EOS or any combination of those techniques. For example, this block may include the features disclosed in FIG. 3 for solving the EOS.

The method 190 may also include performing an action on the earth formation using action-related apparatus and at least one of the estimated liquid molar fraction, vapor molar fraction, liquid mole fraction, vapor mole fraction, liquid saturation, and vapor saturation of components of a hydrocarbon in the nano-pores in the earth formation. In one or more embodiments, the action includes controlling a flow rate of hydrocarbons produced from a borehole penetrating the earth formation to meet or exceed a selected production flow rate. The flow rate may be controlled by controlling a flow control valve for example. In one or more embodiments, the action includes determining a location of a stage in a borehole penetrating the earth formation in which to hydraulically fracture the earth formation using a formation stimulation system and fracturing the earth formation at that stage.

Embodiment 1: A method for estimating liquid and vapor molar fraction of components, liquid mole fraction, vapor mole fraction, liquid saturation, and vapor saturation of a mixture of hydrocarbons in nano-pores in an earth formation, the method comprising: constructing, by a processor, an equation of state (EOS) representing the mixture hydrocarbons in the nano-pores in the earth formation; the EOS comprising a term accounting for capillary pressure in the nano-pores; inputting, by the processor, a composition of the mixture of hydrocarbons and a phase pressure of the hydrocarbons into the EOS; inputting, by the processor, a pore size distribution of the earth formation into the EOS; and solving, by the processor, the EOS to estimate the liquid and vapor molar fraction of components, liquid mole fraction, vapor mole fraction, liquid saturation, and vapor saturation of the mixture of hydrocarbons in the nano-pores in the earth formation.

Embodiment 2: The method according to claim 1, further comprising inputting a vapor phase pressure into the EOS for a gas reservoir or a liquid phase pressure of the mixture of hydrocarbons for an oil reservoir.

Embodiment 3: The method according to claim 2, wherein the EOS comprises the following set of equations:

$$z_i = n_l x_i + n_v y_i, \quad i = 1, 2, \ldots, n_c$$

$$x_i p_l \Phi_{l,i} = y_i p_v \Phi_{v,i} \quad i = 1, 2, \ldots, n_c$$

$$\sum_{i=1}^{n_c} x_i = \sum_{i=1}^{n_c} y_i = \sum_{i=1}^{n_c} z_i = 1$$

$$n_l + n_v = 1$$

$$p_c = p_v - p_l$$

where $x_i$, $y_i$, $z_i$, $\Phi_{l,i}$, and $\Phi_{v,i}$ are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components.

Embodiment 4: The method according to claim 1, further comprising inputting a constant pore size and estimating a liquid or vapor phase pressure.

Embodiment 5: The method according to claim 4, wherein the EOS comprises the following set of equations:

$$z_i = n_l x_i + n_v y_i, \quad i = 1, 2, \ldots, n_c$$

$$x_i p_l \Phi_{l,i} = y_i p_v \Phi_{v,i} \quad i = 1, 2, \ldots, n_c$$

$$p_v - p_l = p_c$$

$$p_c(s_l^*) = \frac{2\sigma \cos\theta}{r_c}, \quad \sigma = \left[\sum_{i=1}^{n_c} (Par)_i \left(\frac{x_i}{\overline{V}_l} - \frac{y_i}{\overline{V}_v}\right)\right]^4$$

$$\frac{n_l \overline{V}_l}{n_l \overline{V}_l + n_v \overline{V}_v} = s_l^*$$

$$\sum_{i=1}^{n_c} x_i = \sum_{i=1}^{n_c} y_i = \sum_{i=1}^{n_c} z_i = 1$$

$$n_l + n_v = 1$$

where $x_i$, $y_i$, $z_i$, $\Phi_{l,i}$, and $\Phi_{v,i}$ are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components; $\overline{V}_l$ and $\overline{V}_v$ are vapor and liquid molar volume, respectively; $(Par)_i$ is the parachor of component I; $s_l^*$ is saturation of liquid phase.

Embodiment 6: The method according to claim 1, further estimating a liquid phase pressure for a shale gas reservoir or estimating a vapor phase pressure for a shale oil reservoir.

Embodiment 7: The method according to claim 6, wherein the EOS comprises the following set of equations:

$$z_i = n_l x_i + n_v y_i, \quad i = 1, 2, \ldots, n_c$$

$$x_i p_l \Phi_{l,i} = y_i p_v \Phi_{v,i} \quad i = 1, 2, \ldots, n_c$$

$$p_v - p_l = p_c$$

$$p_c(s_l^*) = \frac{2\sigma\cos\theta}{r_K}, \quad \sigma = \left[\sum_{i=1}^{n_c} (Par)_i \left(\frac{x_i}{\overline{V}_l} - \frac{y_i}{\overline{V}_v}\right)\right]^4$$

$$\frac{n_l \overline{V}_l}{n_l \overline{V}_l + n_v \overline{V}_v} = \frac{V_L^*}{V_T} = s_l^*$$

$$V_L^* = \sum_{r_j \le r_K} V_j(r_j)$$

$$V_T = \sum_{r_j} V_j(r_j)$$

$$\sum_{i=1}^{n_c} x_i = \sum_{i=1}^{n_c} y_i = \sum_{i=1}^{n_c} z_i = 1$$

$$n_l + n_v = 1$$

where $x_i$, $y_i$, $z_i$, $\Phi_{l,i}$, and $\Phi_{v,i}$ and are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components; $\overline{V}_l$ and $\overline{V}_v$ are vapor and liquid molar volume, respectively; $s^*_l$ is saturation of liquid phase; $\sigma$ is the interfacial tension at the interface between the vapor phase and liquid phase; $(Par)_i$ is the parachor of component I; $V^*_L$ is the liquid volume in the pore volume at which the phase equilibrium is reached Embodiment 8: The method according to claim 1, further comprising inputting capillary pressure data and estimating a liquid phase pressure.

Embodiment 9: The method according to claim 8, wherein the EOS comprises the following set of equations:

$$z_i = n_l x_i + n_v y_i, \quad i = 1, 2, \ldots, n_c$$

$$x_i p_l \Phi_{l,i} = y_i p_v \Phi_{v,i} \quad i = 1, 2, \ldots, n_c$$

$$p_v - p_l = p_c(s_l^*)$$

$$\frac{n_l \overline{V}_l}{n_l \overline{V}_l + n_v \overline{V}_v} = p_c^{-1} = s_l^*$$

$$\sum_{i=1}^{n_c} x_i = \sum_{i=1}^{n_c} y_i = \sum_{i=1}^{n_c} z_i = 1$$

$$n_l + n_v = 1$$

where $x_i$, $y_i$, $z_i$, $\Phi_{l,i}$, and $\Phi_{v,i}$ are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components; $\overline{V}_l$ and $\overline{V}_v$ are vapor and liquid molar volume, respectively; $s^*_l$ is saturation of liquid phase; $\sigma$ is the interfacial tension at the interface between the vapor phase and liquid phase; $V^*_L$ is the liquid volume in the pore volume at which the phase equilibrium is reached; $p_c(s_l)$ is the capillary pressure, and $p_c^{-1}$ is the inverse function of capillary pressure.

Embodiment 10: The method according to claim 1, further comprising measuring a pore size distribution using pore size measuring apparatus.

Embodiment 11: The method according to claim 10, further comprising extracting a core sample of the earth formation using a downhole core sample tool.

Embodiment 12: The method according to claim 1, further comprising performing an action on the earth formation using action-related apparatus and at least one of the estimated liquid molar fraction, vapor molar fraction, liquid mole fraction, vapor mole fraction, liquid saturation, and vapor saturation of components of a hydrocarbon in the nano-pores in the earth formation.

Embodiment 13: The method according to claim 12, wherein the action comprises controlling a flow rate of hydrocarbons produced from a borehole penetrating the earth formation to meet or exceed a selected production flow rate.

Embodiment 14: The method according to claim 12, wherein the action comprises determining a location of a stage in a borehole penetrating the earth formation in which to hydraulically fracture the earth formation using a formation stimulation system and fracturing the earth formation at that stage.

Embodiment 15: A system for estimating liquid and vapor molar fraction of components, liquid mole fraction, vapor mole fraction, liquid saturation, and vapor saturation of a mixture of hydrocarbons in nano-pores in an earth formation, the system comprising: a memory having computer-readable instructions; a processor for executing the computer-readable instructions, the computer-readable instructions comprising: constructing an equation of state (EOS) representing the mixture of hydrocarbons in the nano-pores in the earth formation; the EOS comprising a term accounting for capillary pressure in the nano-pores; inputting a composition of the mixture of hydrocarbons and a phase pressure of the hydrocarbons into the EOS; inputting a pore size distribution of the earth formation into the EOS; and solving the EOS to estimate the liquid and vapor molar fraction of components, liquid mole fraction, vapor mole fraction, liquid saturation, and vapor saturation of the mixture of hydrocarbons in the nano-pores in the earth formation.

Embodiment 16: The system according to claim 15, further comprising a pore size measuring apparatus configured to measure a pore size distribution of the earth formation.

Embodiment 17: The system according to claim 15, further comprising a formation-action related apparatus configured to perform an action on the formation using at least one of the estimated liquid molar fraction, vapor molar fraction, liquid mole fraction, vapor mole fraction, liquid saturation, and vapor saturation of components of a hydrocarbon in the nano-pores in the earth formation.

Embodiment 18: The system according to claim 15, wherein the formation-action related apparatus comprises a formation stimulation system configured to hydraulically fracture the earth formation a location of a stage in a borehole penetrating the earth formation determined by at least one of the estimated liquid molar fraction, vapor molar fraction, liquid mole fraction, vapor mole fraction, liquid saturation, and vapor saturation of components of a hydrocarbon in the nano-pores in the earth formation.

In support of the teachings herein, various analysis components may be used including a digital and/or an analog system. For example, the computer processing system 42 and/or the pore size measuring apparatus 50 may include digital and/or analog systems. The system may have components such as a processor, storage media, memory, input, output, communications link (wired, wireless, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure. Processed data such as a result of an implemented method may be transmitted as a signal via a processor output interface to a signal receiving device. The signal receiving device may be a display monitor or printer for presenting the result to a user. Alternatively or in addition, the signal receiving device may be memory or a storage medium. It can be appreciated that storing the result in memory or the storage medium will transform the memory or storage medium into a new state (containing the result) from a prior state (not containing the result). Further, an alert signal may be transmitted from the processor to a user interface if the result exceeds a threshold value.

Further, various other components may be included and called upon for providing for aspects of the teachings herein. For example, a sensor, transmitter, receiver, transceiver, antenna, controller, optical unit, electrical unit or electromechanical unit may be included in support of the various aspects discussed herein or in support of other functions beyond this disclosure.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms. The term "configured" relates one or more structural limitations of a device that are required for the device to perform the function or operation for which the device is configured.

The flow diagram depicted herein is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

While one or more embodiments have been shown and described, modifications and substitutions may be made thereto without departing from the spirit and scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for transforming a property of an earth formation based on estimating liquid and vapor molar fraction of components, liquid mole fraction, vapor mole fraction, liquid saturation, and vapor saturation of a mixture of hydrocarbons in nano-pores in an earth formation, the method comprising:
   constructing, by a processor, an equation of state (EOS) representing the mixture hydrocarbons in the nano-pores in the earth formation; the EOS comprising a term accounting for capillary pressure in the nano-pores;
   inputting, by the processor, a composition of the mixture of hydrocarbons and a phase pressure of the hydrocarbons into the EOS;
   inputting, by the processor, a pore size distribution of the earth formation into the EOS;
   solving, by the processor, the EOS to estimate the liquid and vapor molar fraction of components, liquid mole fraction, vapor mole fraction, liquid saturation, and vapor saturation of the mixture of hydrocarbons in the nano-pores in the earth formation; and
   transforming the property of the earth formation by performing a physical action on the earth formation using physical action-related apparatus based on at least one of the estimated liquid molar fraction, vapor molar fraction, liquid mole fraction, vapor mole fraction, liquid saturation, and vapor saturation of components of a hydrocarbon in the nano-pores in the earth formation.

2. The method according to claim 1, further comprising inputting a vapor phase pressure into the EOS for a gas reservoir or a liquid phase pressure of the mixture of hydrocarbons for an oil reservoir.

3. The method according to claim 2, wherein the EOS comprises the following set of equations:

$$z_i = n_l x_i + n_v y_i, \quad i = 1, 2, \ldots, n_c$$

$$x_i p_l \Phi_{l,i} = y_i p_v \Phi_{v,i} \quad i = 1, 2, \ldots, n_c$$

$$\sum_{i=1}^{n_c} x_i = \sum_{i=1}^{n_c} y_i = \sum_{i=1}^{n_c} z_i = 1$$

$$n_l + n_v = 1$$

$$p_c = p_v - p_l$$

where $x_i$, $y_i$, $z_i$, $\Phi_{l,i}$, and $\Phi_{v,i}$ are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components.

4. The method according to claim 1, further comprising inputting a constant pore size and estimating a liquid or vapor phase pressure.

5. The method according to claim 4, wherein the EOS comprises the following set of equations:

$$z_i = n_l x_i + n_v y_i, \quad i = 1, 2, \ldots, n_c$$

$$x_i p_l \Phi_{l,i} = y_i p_v \Phi_{v,i} \quad i = 1, 2, \ldots, n_c$$

$$p_v - p_l = p_c$$

$$p_c(s_l^*) = \frac{2\sigma \cos\theta}{r_c}, \quad \sigma = \left[\sum_{i=1}^{n_c} (Par)_i \left(\frac{x_i}{\overline{V}_l} - \frac{y_i}{\overline{V}_v}\right)\right]^4$$

$$\frac{n_l \overline{V}_l}{n_l \overline{V}_l + n_v \overline{V}_v} = s_l^*$$

$$\sum_{i=1}^{n_c} x_i = \sum_{i=1}^{n_c} y_i = \sum_{i=1}^{n_c} z_i = 1$$

$$n_l + n_v = 1$$

where $x_i$, $y_i$, $z_i$, $\Phi_{l,i}$, and $\Phi_{v,i}$ are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components; $\overline{V}_l$ and $\overline{V}_v$ are vapor and liquid molar volume, respectively; $(Par)_i$ is the parachor of component I; $s_l^*$ is saturation of liquid phase.

6. The method according to claim 1, further estimating a liquid phase pressure for a shale gas reservoir or estimating a vapor phase pressure for a shale oil reservoir.

7. The method according to claim 6, wherein the EOS comprises the following set of equations:

$$z_i = n_l x_i + n_v y_i, \quad i = 1, 2, \ldots, n_c$$

$$x_i p_l \Phi_{l,i} = y_i p_v \Phi_{v,i} \quad i = 1, 2, \ldots, n_c$$

$$p_v - p_l = p_c$$

$$p_c(s_l^*) = \frac{2\sigma \cos\theta}{r_K}, \quad \sigma = \left[\sum_{i=1}^{n_c} (Par)_i \left(\frac{x_i}{\overline{V}_l} - \frac{y_i}{\overline{V}_v}\right)\right]^4$$

$$\frac{n_l \overline{V}_l}{n_l \overline{V}_l + n_v \overline{V}_v} = \frac{V_L^*}{V_T} = s_l^*$$

$$V_L^* = \sum_{r_j \leq r_K} V_j(r_j)$$

$$V_T = \sum_{r_j} V_j(r_j)$$

$$\sum_{i=1}^{n_c} x_i = \sum_{i=1}^{n_c} y_i = \sum_{i=1}^{n_c} z_i = 1$$

$$n_l + n_v = 1$$

where $x_i$, $y_i$, $z_i$, $\Phi_{l,i}$, and $\Phi_{v,i}$ are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components; $\overline{V}_l$ and $\overline{V}_v$ are vapor and liquid molar volume, respectively; $s_l^*$ is saturation of liquid phase; $\sigma$ is the interfacial tension at the interface between the vapor phase and liquid phase; $(Par)_i$ is the parachor of component I; $V_L^*$ is the liquid volume in the pore volume at which the phase equilibrium is reached.

8. The method according to claim 1, further comprising inputting capillary pressure data and estimating a liquid phase pressure.

9. The method according to claim 8, wherein the EOS comprises the following set of equations:

$$z_i = n_l x_i + n_v y_i, \quad i = 1, 2, \ldots, n_c$$

$$x_i p_l \Phi_{l,i} = y_i p_v \Phi_{v,i} \quad i = 1, 2, \ldots, n_c$$

$$p_v - p_l = p_c(s_l^*)$$

$$\frac{n_l \overline{V}_l}{n_l \overline{V}_l + n_v \overline{V}_v} = p_c^{-1} = s_l^*$$

$$\sum_{i=1}^{n_c} x_i = \sum_{i=1}^{n_c} y_i = \sum_{i=1}^{n_c} z_i = 1$$

$$n_l + n_v = 1$$

where $x_i$, $y_i$, $z_i$, $\Phi_{l,i}$, and $\Phi_{v,i}$ are liquid molar fraction, vapor molar fraction, and global molar fraction, liquid and vapor fugacity coefficients of component i, respectively; $p_v$ and $p_l$ are vapor and liquid phase pressure, respectively, $n_v$ and $n_l$ are vapor and liquid mole fractions, respectively; $n_c$ is the total number of components; $\overline{V}_l$ and $\overline{V}_v$ are vapor and liquid molar volume, respectively; $s_l^*$ is saturation of liquid phase; $\sigma$ is the interfacial tension at the interface between the vapor phase and liquid phase; $V_L^*$ is the liquid volume in the pore volume at which the phase equilibrium is reached; $p_c(s_l)$ is the capillary pressure, and $p_c^{-1}$ is the inverse function of capillary pressure.

10. The method according to claim 1, further comprising measuring a pore size distribution using pore size measuring apparatus.

11. The method according to claim 10, further comprising extracting a core sample of the earth formation using a downhole core sample tool.

12. The method according to claim 1, wherein the physical action comprises controlling a flow rate of hydrocarbons produced from a borehole penetrating the earth formation to meet or exceed a selected production flow rate.

13. The method according to claim 1, wherein the physical action comprises determining a location of a stage in a borehole penetrating the earth formation in which to hydraulically fracture the earth formation using a formation stimulation system and fracturing the earth formation at that stage.

14. The method according to claim 1, wherein the physical action comprises injecting acid into a borehole penetrating the earth formation using a well rejuvenation system.

15. A system for transforming a property of an earth formation based on estimating liquid and vapor molar fraction of components, liquid mole fraction, vapor mole fraction, liquid saturation, and vapor saturation of a mixture of hydrocarbons in nano-pores in an earth formation, the system comprising:
 a memory having computer-readable instructions;
 a processor for executing the computer-readable instructions, the computer-readable instructions comprising:
 constructing an equation of state (EOS) representing the mixture of hydrocarbons in the nano-pores in the earth formation; the EOS comprising a term accounting for capillary pressure in the nano-pores;

inputting a composition of the mixture of hydrocarbons and a phase pressure of the hydrocarbons into the EOS;
inputting a pore size distribution of the earth formation into the EOS; and
solving the EOS to estimate the liquid and vapor molar fraction of components, liquid mole fraction, vapor mole fraction, liquid saturation, and vapor saturation of the mixture of hydrocarbons in the nano-pores in the earth formation;
physical action-related apparatus configured to transform the property of the earth formation by performing a physical action on the earth formation based on at least one of the estimated liquid molar fraction, vapor molar fraction, liquid mole fraction, vapor mole fraction, liquid saturation, and vapor saturation of components of a hydrocarbon in the nano-pores in the earth formation.

16. The system according to claim 15, further comprising a pore size measuring apparatus configured to measure a pore size distribution of the earth formation.

17. The system according to claim 15, wherein the physical action-related apparatus comprises a formation stimulation system configured to hydraulically fracture the earth formation a location of a stage in a borehole penetrating the earth formation determined by at least one of the estimated liquid and vapor molar fraction of components, liquid mole fraction, vapor mole fraction, liquid saturation, and vapor saturation of a mixture of hydrocarbons in nano-pores in an earth formation.

18. The system according to claim 15, wherein the physical action-related apparatus comprises at least one of a pump and a flow control valve configured to control a flow rate of hydrocarbons produced from a borehole penetrating the earth formation to meet or exceed a selected production flow rate.

19. The system according to claim 15, wherein the physical action-related apparatus comprises a well rejuvenation system configured to inject acid into a borehole penetrating the earth formation.

* * * * *